(12) United States Patent
Mushan et al.

(10) Patent No.: US 7,857,145 B2
(45) Date of Patent: Dec. 28, 2010

(54) MOUNTING BRACKET FOR SQUARE HOLE RACKS AND ROUND HOLE RACKS

(75) Inventors: Huang Mushan, Singapore (SG); Wenming Yang, Singapore (SG); Meng Kee Koh, Singapore (SG); Alfred E. Barry, Jr., Atlanta, GA (US)

(73) Assignee: Central Industrial Supply Company, Tucson, AZ (US)

( * ) Notice: Subject to any disclaimer, the term of this patent is extended or adjusted under 35 U.S.C. 154(b) by 873 days.

(21) Appl. No.: 11/527,329

(22) Filed: Sep. 26, 2006

(65) Prior Publication Data

US 2008/0073469 A1 Mar. 27, 2008

(51) Int. Cl.
*A47F 7/00* (2006.01)
(52) U.S. Cl. ...................................................... 211/26
(58) Field of Classification Search .................. 211/26, 211/192, 187, 153, 190; 403/321, 324, 328; 108/107, 106; 248/221.11, 243
See application file for complete search history.

(56) References Cited

U.S. PATENT DOCUMENTS

| | | | | |
|---|---|---|---|---|
| 471,481 A | * | 3/1892 | Hart | 211/153 |
| 1,394,513 A | * | 10/1921 | Albonesi | 292/60 |
| 1,778,075 A | * | 10/1930 | Harris | 211/153 |
| 3,273,720 A | * | 9/1966 | Seiz | 211/192 |
| 3,337,062 A | | 8/1967 | Seiz | |
| 3,341,027 A | * | 9/1967 | Mackin, Jr. et al. | 108/188 |
| 3,362,738 A | * | 1/1968 | Dygert et al. | 403/108 |
| 3,388,809 A | * | 6/1968 | Elwood | 211/190 |
| 3,612,290 A | * | 10/1971 | Evans | 211/192 |
| 4,074,812 A | * | 2/1978 | Skubic et al. | 211/192 |
| 4,165,854 A | * | 8/1979 | Duly | 248/408 |
| 4,243,342 A | * | 1/1981 | Marto | 403/324 |
| 4,257,193 A | * | 3/1981 | Williams | 49/465 |
| 4,292,902 A | * | 10/1981 | Barrineau | 108/146 |
| 4,379,430 A | * | 4/1983 | Ruschitzka | 108/107 |
| 4,387,872 A | | 6/1983 | Hogue | |
| 4,519,511 A | * | 5/1985 | Mendenhall | 211/187 |
| 4,602,890 A | * | 7/1986 | Duda | 403/105 |
| 4,603,782 A | * | 8/1986 | Fenwick | 211/153 |
| 4,635,327 A | * | 1/1987 | Netznik | 24/653 |
| 4,972,783 A | * | 11/1990 | Crissman et al. | 108/107 |
| 5,237,791 A | * | 8/1993 | Scanlan | 52/655.1 |
| 5,571,256 A | | 11/1996 | Good et al. | |
| 5,833,337 A | | 11/1998 | Kofstad | |
| 5,842,586 A | * | 12/1998 | Melby | 211/187 |

(Continued)

*Primary Examiner*—Sarah Purol
(74) *Attorney, Agent, or Firm*—Mark W. Handley; Handley Law Firm, PLLC

(57) ABSTRACT

A mounting bracket (22) is provided for securing to both square-hole racks (12) and round hole racks (16). An inner support pin (24) extends for fitting within round-shaped holes (18) and engaging a side of the round-hole racks (16). An outer support sleeve (26) is slidably moveable over the inner support pin (24) for fitting within square-shaped holes (14) and engaging a side of the square-hole racks (16). A bias spring (40) urges the outer support sleeve (26) to extend over the inner support pin (24). A lock pin assembly (27) has an enlarged diameter portion (30) for fitting within the square holes (14) and a smaller diameter portion (28) for fitting within the round holes (18) to lock the support sleeve (26) and the support in (24) in mounting holes (14 and 18) of respective ones of the square-hole racks (12) and the round-hole racks (16).

20 Claims, 15 Drawing Sheets

U.S. PATENT DOCUMENTS

| | | | |
|---|---|---|---|
| 6,155,441 A * | 12/2000 | Andersen et al. | 211/192 |
| 6,230,903 B1 | 5/2001 | Abbott | |
| 6,305,556 B1 | 10/2001 | Mayer | |
| 6,373,707 B1 | 4/2002 | Hutchins | |
| 6,435,354 B1 | 8/2002 | Gray et al. | |
| 6,442,030 B1 | 8/2002 | Mammoser et al. | |
| 6,523,918 B1 | 2/2003 | Baiza | |
| 6,554,142 B2 | 4/2003 | Gray | |
| 6,578,939 B1 | 6/2003 | Mayer | |
| 6,615,992 B1 | 9/2003 | Lauchner et al. | |
| 6,648,149 B2 | 11/2003 | Robertson | |
| 6,681,942 B2 | 1/2004 | Haney | |
| 6,726,164 B1 | 4/2004 | Baiza et al. | |
| 6,802,426 B2 * | 10/2004 | Weaver et al. | 211/192 |
| 6,854,611 B2 * | 2/2005 | Powell | 211/192 |
| 6,856,505 B1 | 2/2005 | Venegas | |

* cited by examiner

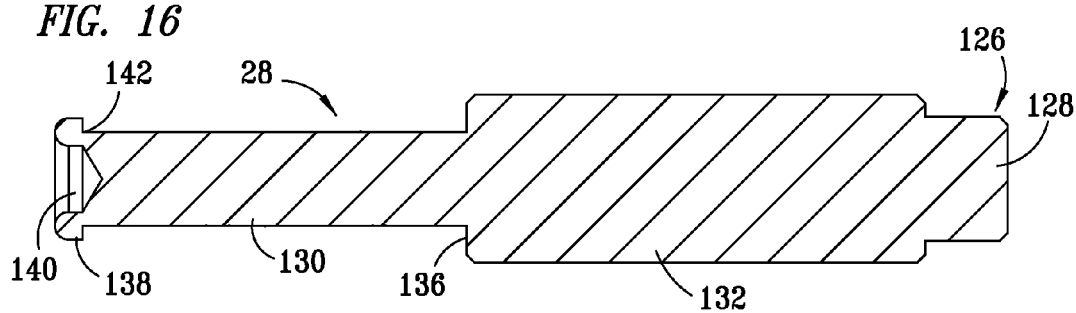
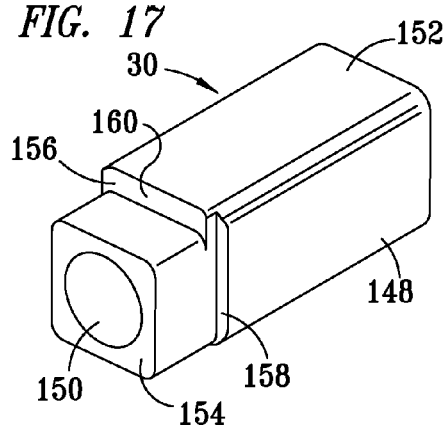
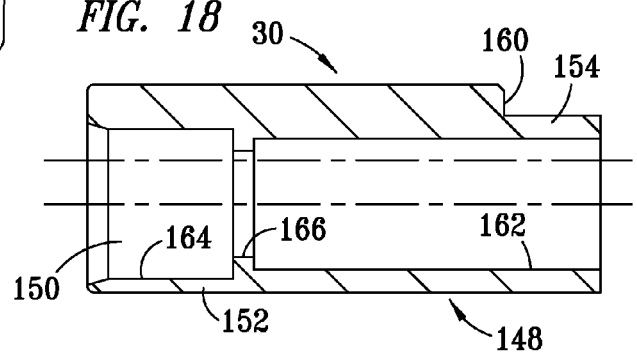
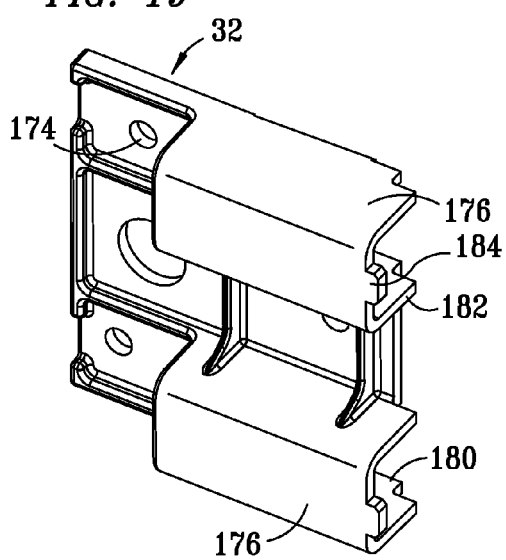
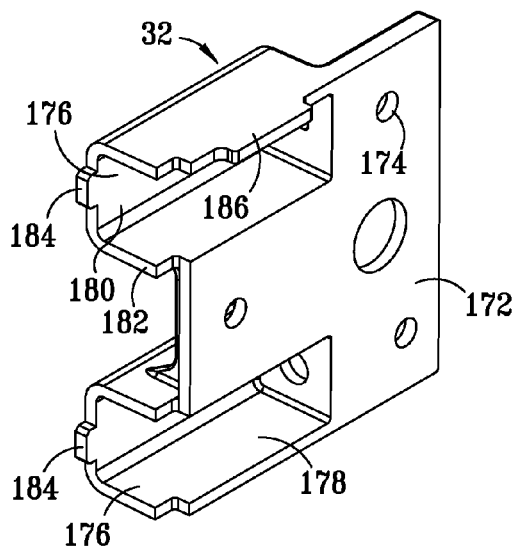

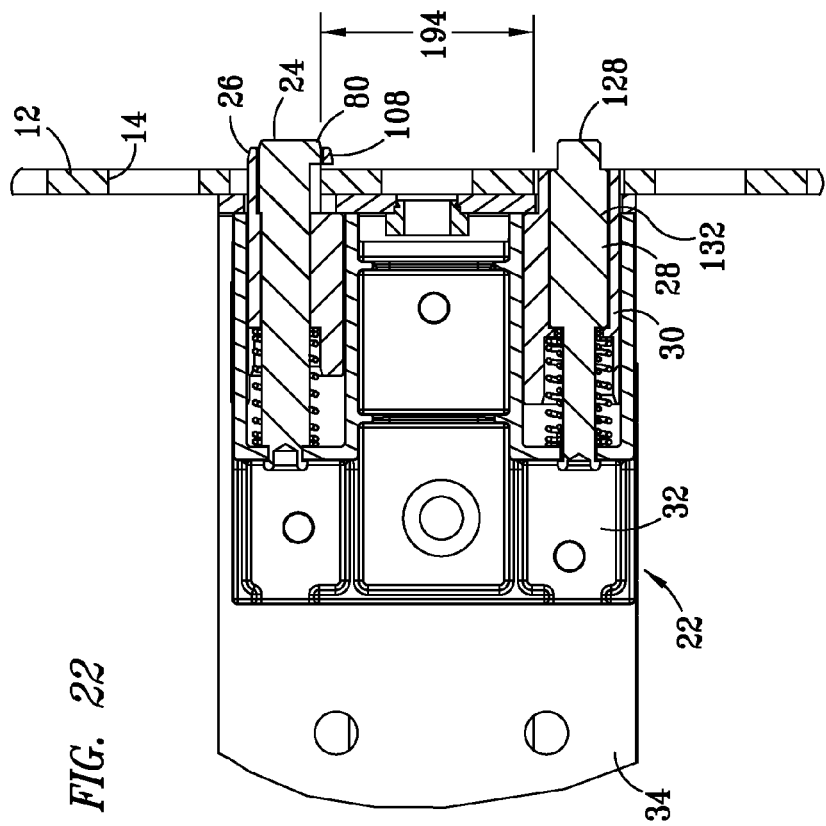
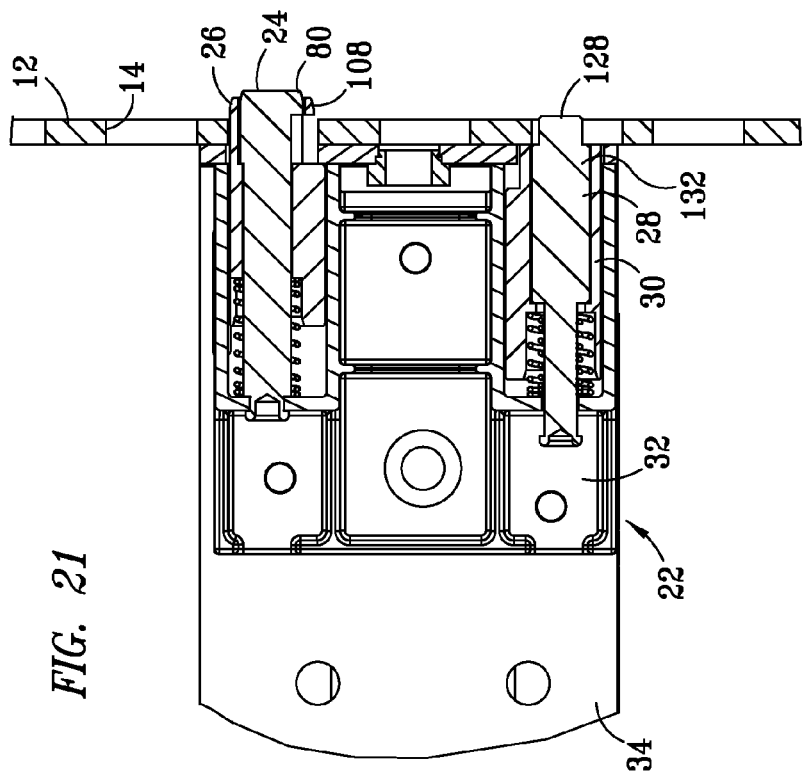

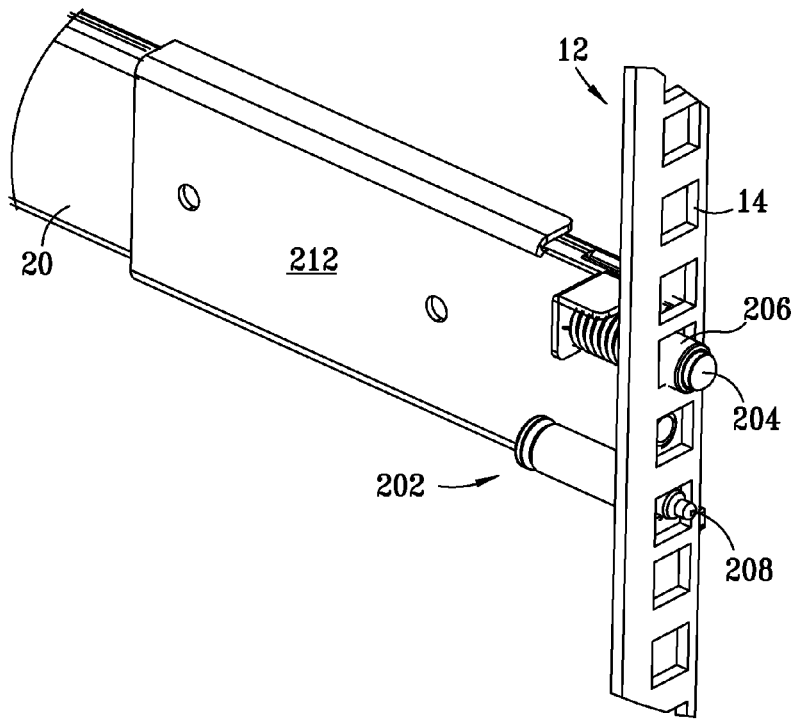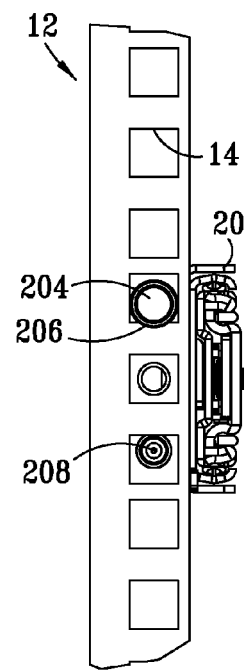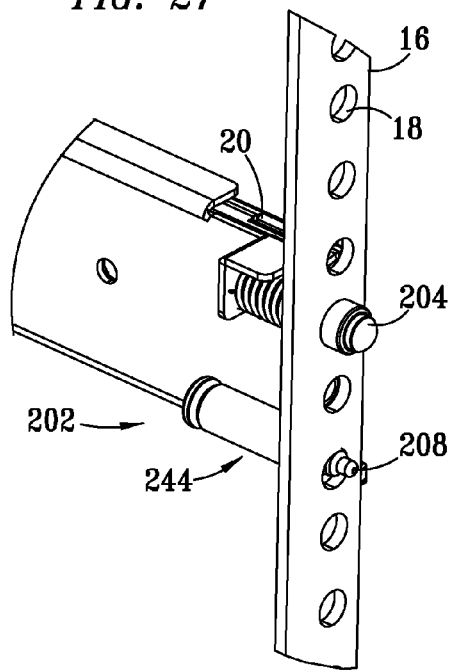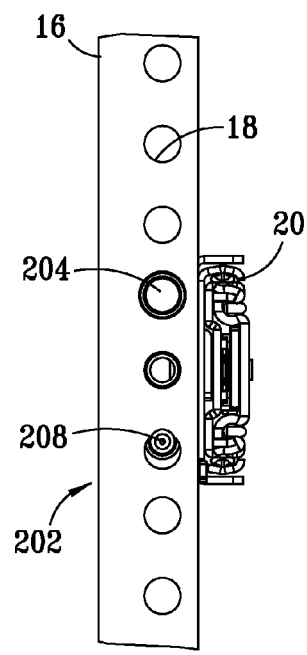

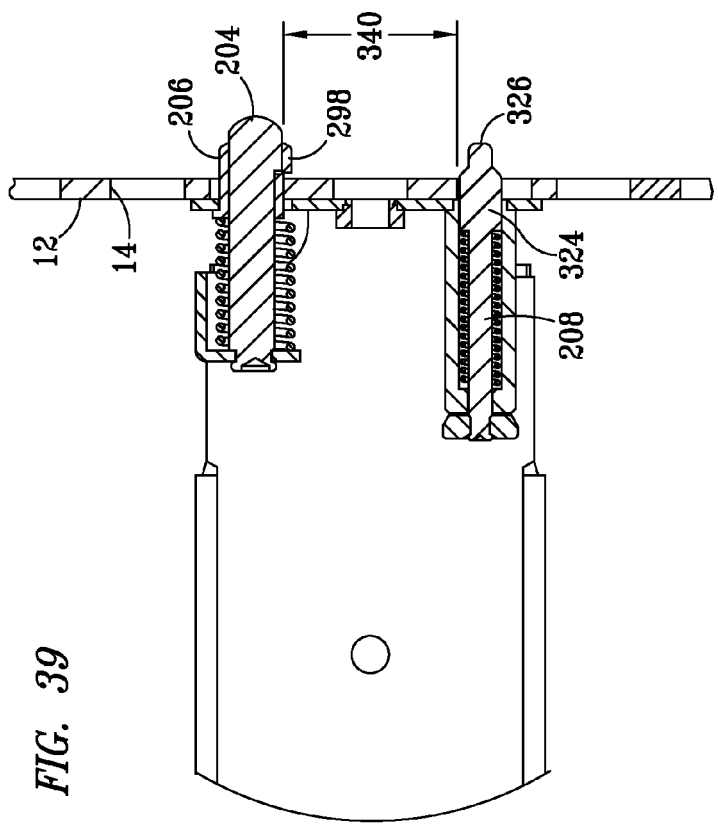
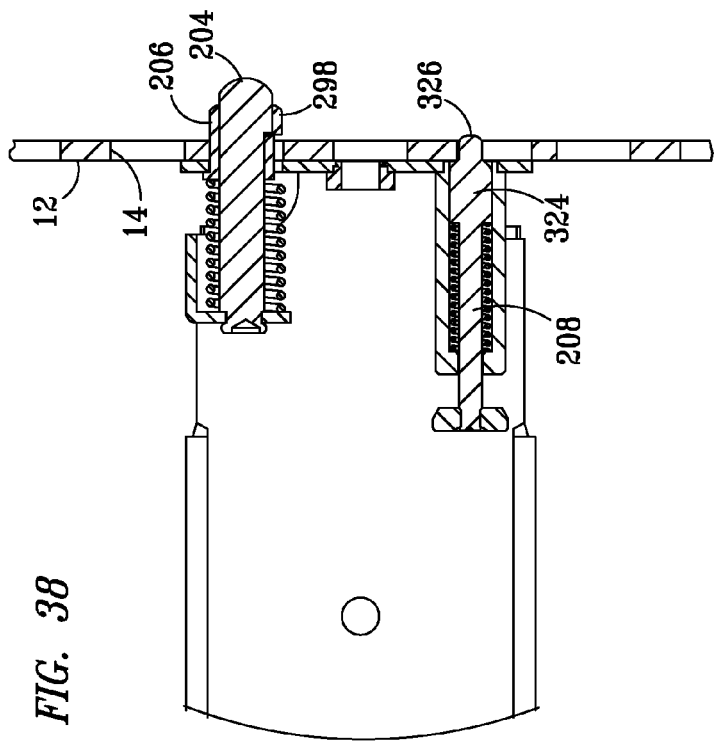

MOUNTING BRACKET FOR SQUARE HOLE RACKS AND ROUND HOLE RACKS

TECHNICAL FIELD OF THE INVENTION

The present invention relates in general to mounting brackets for securing rails and slides to racks and frames, and in particular to securing rails and slides to server system racks.

BACKGROUND OF THE INVENTION

Server system racks are typically provided by either square-hole racks which have square-shaped mounting holes, or by round-hole racks which have round-shaped mounting holes. Server system racks have been used for rack mounted computer servers, telecommunication servers, power distribution units, or other electronic devices. Equipment chassis which are mounted in such server system racks are usually mounted to drawer slides which are connected to the server system racks such that the equipment chassis may then be moved linearly forward of the racks supported by the drawer slides in a cantilevered arrangement, for ease of installation and so that the equipment chassis may be easily moved forward of the racks for servicing. An innermost member of the drawer slides is mounted to each side of the equipment chassis, and is herein referred to a chassis member. An outermost member of the drawer slides is non-movably secured to the racks, and is herein referred to as a rack member. Drawer slide members disposed between inner and outer drawer slide members, if included in the particular drawer slides, are herein referred to as intermediate members.

The rack members of the drawer slides are mounted either directly to the racks with mounting brackets, or to mounting rails formed of long strips of sheet metal which are secured to the racks by mounting brackets similar to those by which the rack members are directly mounted to the racks. Some mounting brackets for securing drawer slides to server system racks have been provided which do not require hand tools to secure the mounting brackets to the racks, rather than requiring wrenches, screw drivers, and the like, to secure the mounting brackets and drawer slides to the racks. These type mounting brackets have been called tool-less mounting brackets, and are usually provided for fitting only one type of rack, either the square-hole racks or the round-hole. This requires that such rail bracket hardware be specified and shipped to provide mounting brackets for fitting only one particular type of rack.

SUMMARY OF THE INVENTION

A tool-less rail mounting bracket is provided which may be interchangeably secured to either square-hole racks or round-hole racks. The mounting bracket has a universal locking feature provided by a support pin assembly, which includes an inner support pin and an outer support sleeve, and a lock pin assembly, which includes at least one lock pin and locking surfaces of two different sizes. The outer support sleeve slidably fits over the inner support pin. For square-hole racks, the outer support sleeve will remain in an extended position over the inner support pin and will fit within one of the square-shaped holes. A protuberance is provided which extends radially outward from the forward end of the outer support sleeve to hook the support sleeve to the rack frame, within one of the square-shaped holes. A flat machined onto the body of the outer support sleeve provides the protuberance and enables the support sleeve to drop slightly and lock onto the square hole in the rack. A compression spring provides back-up pressure to press the outer support sleeve into the extended position over the inner support pin, and provides sufficient movement of the support sleeve to absorb minor differences in rack dimensions. For round-hole racks, the outer support sleeve is of a size which will not fit within the round-shaped holes of conventional round-hole racks. The outer support sleeve will engage the backside of the rack frame adjacent to one of the round-shaped holes in which the inner support pin will be inserted, and will be pushed rearward against the force of the associated coil spring so that only the inner support pin is inserted into the particular round-shaped hole. A forward end of the support pin has a protuberance which extends radially outward to hook the support pin to the rack frame, within the particular round-shaped hole. The lock pin assembly locks one of the support pin and the support sleeve in a rack mounting hole of a respective one of either a round hole-rack or a square-hole rack.

In a first embodiment, the lock pin assembly preferably includes a lock pin and a lock sleeve, with the lock sleeve slidably extending over the lock pin. The lock pin preferably has an exterior surface with a first and a second diameters which define a locating surface and an adjacent locking surface, respectively. The first diameter is preferably provided on a terminal end tip of the lock pin and is spaced apart from the support pin and the support sleeve for registering within one of the round-shaped mounting holes of a round-hole rack, such that when the end tip of the lock pin is disposed in a respective round-shaped mounting hole, the support pin and corresponding protuberance may be passed through a corresponding round-shaped mounting hole within which the support pin is being inserted. The second, larger diameter of the lock pin disposed adjacent to the end tip is inserted further into a respective rack mounting hole to prevent passage of the protuberance through corresponding mounting hole in which the support pin is inserted, locking the support pin to the rack. When used with a square-hole rack, the end tip of the lock pin registers within a respective mounting hole of a round-hole rack, spaced apart from the respective support sleeve of the mounting bracket such that the protuberance extending radially from the support sleeve may be passed through the corresponding mounting hole within which the support pin is inserted. The lock sleeve is spaced apart form the support sleeve such that when the lock sleeve is inserted over the lock pin and into the respective mounting hole, the protuberance extending radially from the support sleeve cannot be removed from within the respective hole within which the support sleeve is inserted. Preferably, a geometric longitudinal centerline for the support sleeve is offset from the geometric longitudinal centerline for the support pin, and a geometric longitudinal centerline for the lock sleeve is offset from the geometric longitudinal centerline for the lock pin.

In a second embodiment, an alternative lock pin assembly is provided having a lock pin with a first and a second diameters which define two adjacent locking surfaces which are spaced apart from the support pin and the support sleeve for registering within respective mounting holes of square-hole racks and round-hole racks. The first diameter is preferably provided on a terminal end tip of the lock pin, which is spaced apart from the respective support pin of the mounting bracket, such that the protuberance extending radially from the support pin cannot be removed from within the corresponding mounting hole within which the support pin is inserted. The second diameter is preferably provided on a portion of the lock pin which is adjacent the end tip of the lock pin, and is spaced apart from the respective support sleeve of the mounting bracket such that the protuberance extending radially from the support sleeve cannot be removed from within the respective hole within which the second diameter portion of the lock pin is inserted into the respective one of the mounting holes.

DESCRIPTION OF THE DRAWINGS

For a more complete understanding of the present invention and the advantages thereof, reference is now made to the following description taken in conjunction with the accompanying Drawings in which FIGS. 1 through 41 show various aspects for mounting bracket for square and round hole racks devices made according to the present invention, as set forth below:

FIG. 1 is a partial perspective view a universal mounting bracket made according to the present invention securing a drawer slide to a square-hole rack;

FIG. 2 is a partial perspective view the universal mounting bracket securing the drawer slide to a round-hole rack;

FIG. 3 is a partial perspective view of the mounting bracket and the drawer slide secured to the square-hole rack;

FIG. 4 is a partial end view of the mounting bracket and the drawer slide secured to the square-hole rack;

FIG. 5 is a partial perspective view of the mounting bracket and the drawer slide secured to a round-hole rack;

FIG. 6 is an end view of the mounting bracket and the drawer slide secured to the round-hole rack;

FIG. 7 is a perspective view of the mounting bracket;

FIGS. 8 and 9 are exploded, perspective views of the mounting bracket taken from opposite sides of the mounting bracket;

FIG. 10 is a longitudinal sectional view of the mounting bracket 22, taken along section line 10-10 of FIG. 7;

FIG. 11 is a perspective view of a support pin for the mounting bracket;

FIG. 12 is a longitudinal section view of the support pin;

FIG. 13 is a perspective view of a support sleeve for the mounting bracket;

FIG. 14 is a longitudinal section view of the support sleeve;

FIG. 15 is a perspective view of a lock pin for the mounting bracket;

FIG. 16 is a longitudinal section view of the lock pin;

FIG. 17 is a perspective view of a lock sleeve for the mounting bracket;

FIG. 18 is a longitudinal section view of lock sleeve;

FIGS. 19 and 20 are perspective views of a housing cover for the mounting bracket;

FIGS. 21-22 are sectional views, as taken along section line 10-10 of FIG. 7, and show operation of the mounting bracket being secured to a square-hole rack;

FIGS. 23-24 are sectional views, as taken along section line 10-10 of FIG. 7, and show operation of the mounting bracket being secured to a round-hole rack;

FIG. 25 is a partial perspective view of an alternative mounting bracket and the drawer slide secured to the square-hole rack;

FIG. 26 is a partial end view of the alternative mounting bracket and the drawer slide secured to the square-hole rack;

FIG. 27 is a partial perspective view of the alternative mounting bracket and the drawer slide secured to a round-hole rack;

FIG. 28 is an end view of the alternative mounting bracket and the drawer slide mounted to a round-hole rack;

FIG. 29 is a perspective view of the alternative mounting bracket;

FIG. 30 is an exploded, perspective views of the alternative mounting bracket;

FIG. 31 is a longitudinal sectional view of the mounting bracket 22, taken along section line 31-31 of FIG. 29;

FIG. 32 is a perspective view of a support pin for the mounting bracket;

FIG. 33 is a longitudinal section view of the support pin;

FIG. 34 is a perspective view of a support sleeve for the mounting bracket;

FIG. 35 is a longitudinal section view of the support sleeve;

FIG. 36 is a perspective view of a lock pin for the mounting bracket;

FIG. 37 is a longitudinal section view of the lock pin;

FIGS. 38-39 are sectional views, as taken along section line 31-31 of FIG. 29, and show operation of the mounting bracket being secured to a square-hole rack; and FIGS. 40-41 are sectional views, as taken along section line 31-31 of FIG. 29, and show operation of the mounting bracket being secured to a round-hole rack.

DETAILED DESCRIPTION OF THE INVENTION

Figure 1:
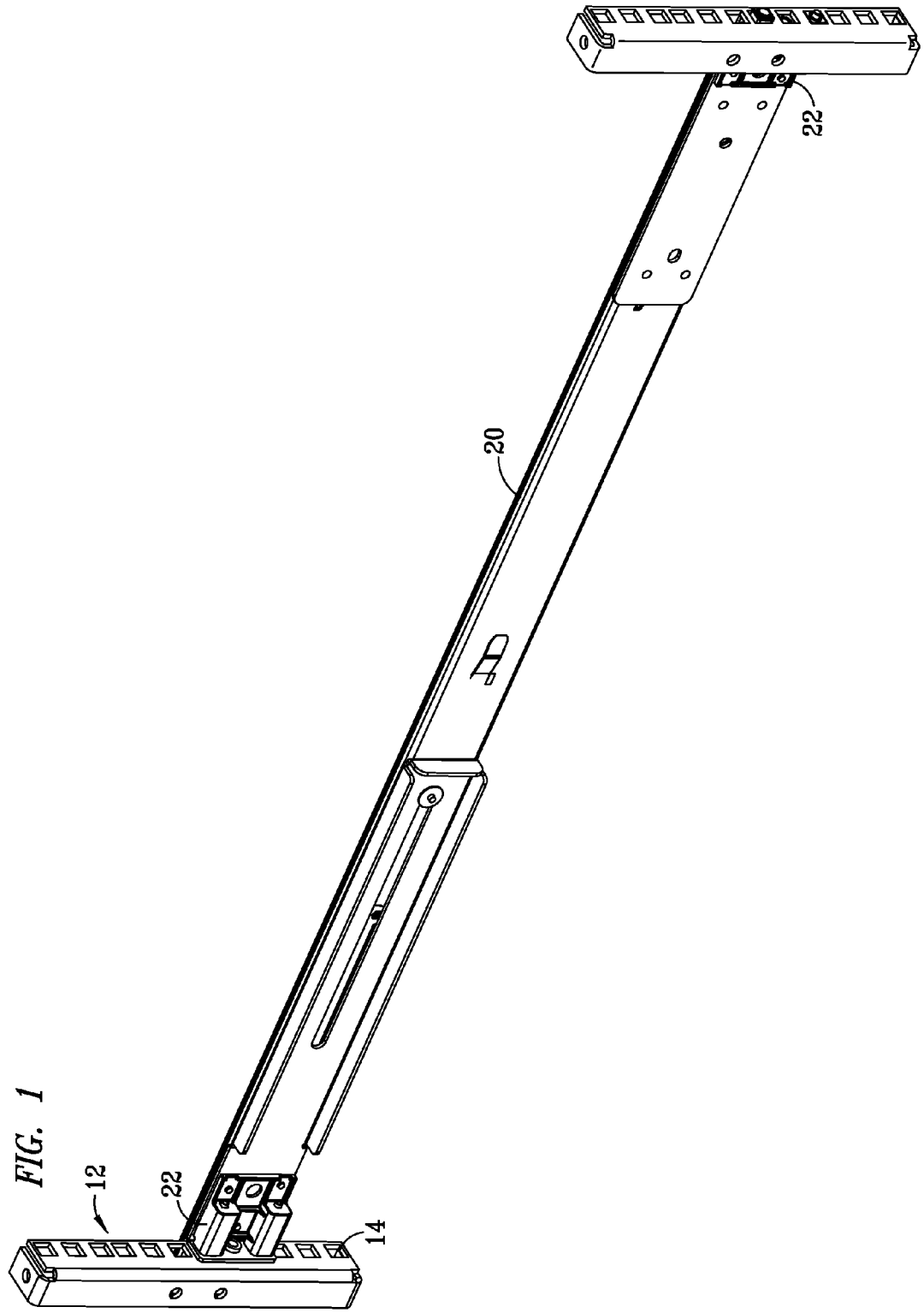
Figure 2:
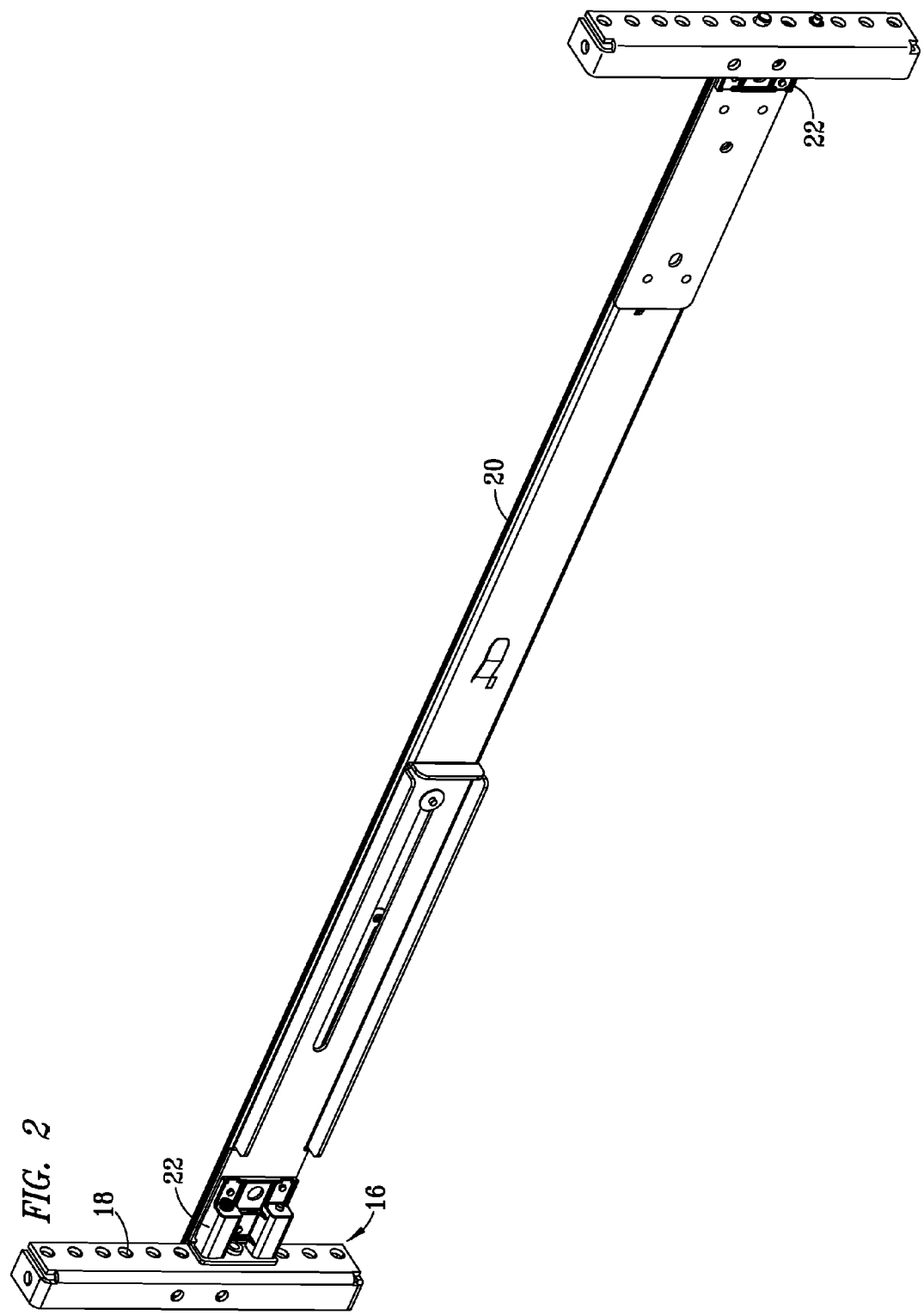

FIG. 1 is a partial perspective view a universal mounting bracket 22 made according to the present invention securing a drawer slide 20 to a square-hole rack 12. FIG. 2 is a partial perspective view the universal mounting bracket 20 securing the drawer slide to a round-hole rack 16. The same mounting bracket 22 is used for securing the drawer slide 20 to the square-hole rack 12 of FIG. 1 and the round-hole rack 16 of FIG. 2.

Figure 3:
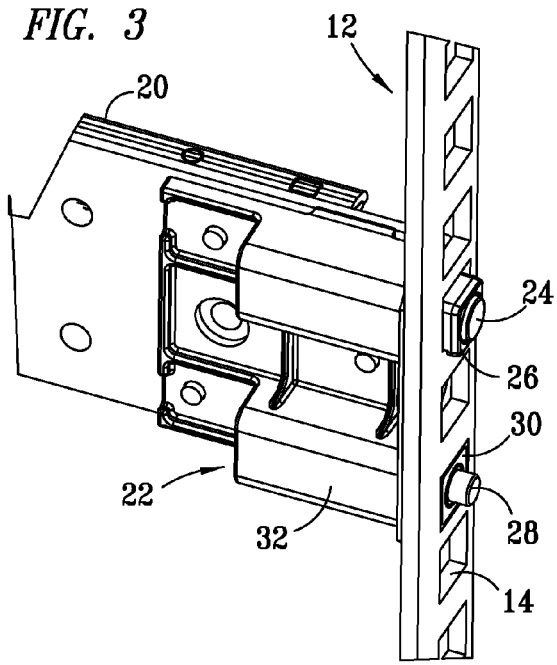
Figure 4:
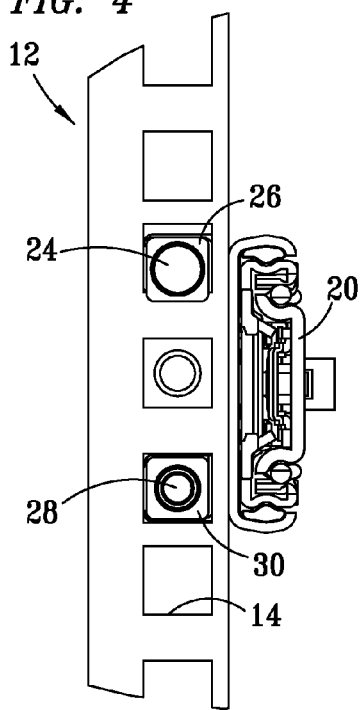
Figure 5:
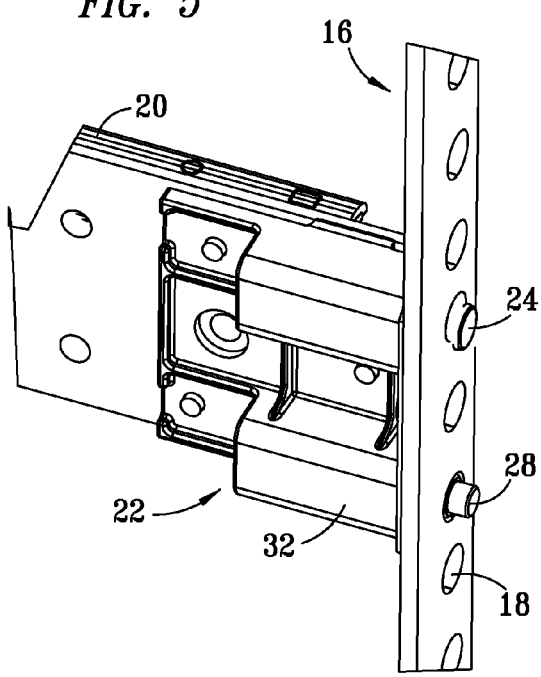
Figure 6:
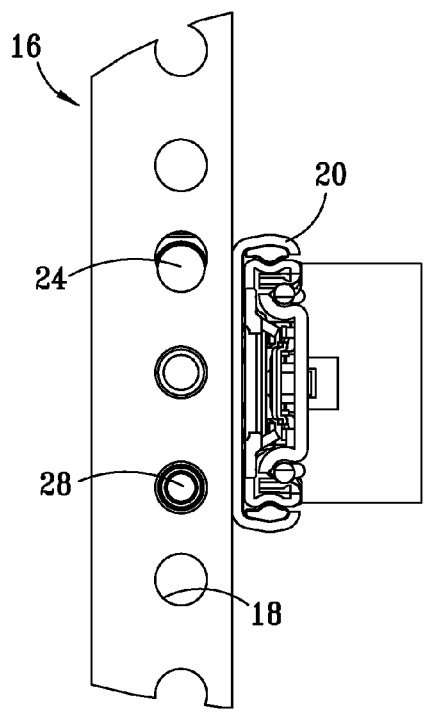

FIG. 3 is a partial perspective view and FIG. 4 is an end view of the square-hole rack 12 and the drawer slide 20 secured to the rack 12 by means of the universal mounting bracket 22. FIG. 5 is a partial perspective view and FIG. 6 is an end view of the drawer slide 20 being secured to the round-hole rack 16 by the mounting bracket 22. The mounting bracket 22 has a housing 32 which is preferably provide by a cover mounted to a bracket member 34. A support pin 24 and a support sleeve 26 extend from a forward end of the cover 32 to provide a hook pin and hook sleeve, respectively, for securing to the mounting bracket 22 to one of the racks 12 and 16, respectively. Preferably, the support pin 24 is mounted in fixed relation to the mounting bracket 22 and the support sleeve 26 slidably extends from within the housing cover 32. The mounting bracket 22 further includes a lock pin 28 and a lock sleeve 30, both of which slidably extend from a second portion of the housing 32. When the mounting bracket 22 is secured to the square-hole rack 12, the support sleeve 26 and the lock sleeve 30 will slidably extend over support pin 24 and the lock pin 28, respectively, and engage within spaced apart pairs of the square mounting holes 14 to secure the mounting bracket 22 to the rack 12. When the mounting bracket 22 is secured to the round-hole rack 16, the support pin 24 will hook to the rack 16 and the lock pin 28 fit within one of the round holes 18 to prevent removal of the support pin from the one of the round holes within which the support pin 24 is disposed. The support sleeve 26 and the lock sleeve 30 will be retracted back into the housing cover 32, being of a size which is to large to fit within one of the round holes 18 in the rack 16.

Figure 7:
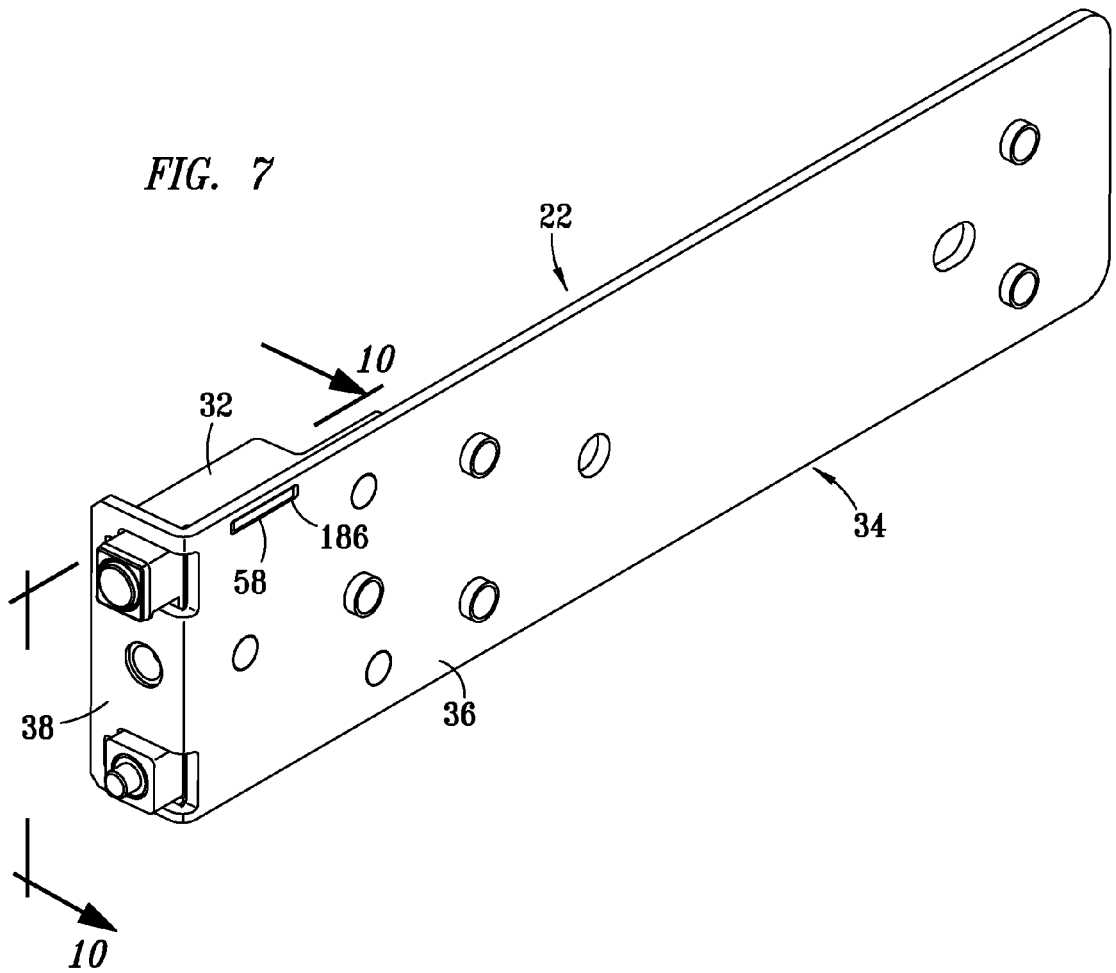

FIG. 7 is a perspective view of the mounting bracket 22, taken from an inward side of the bracket 22. The mounting bracket 22 includes a bracket member 34 to which the housing 32 is mounted as a cap or a cover. The bracket member 34 has a main body 36 and a flange end 38. The flange end 38 is preferably defined by forming an outward end of the main body 36 to be orthogonal to a planar surface of the main body 36.

Figure 8:
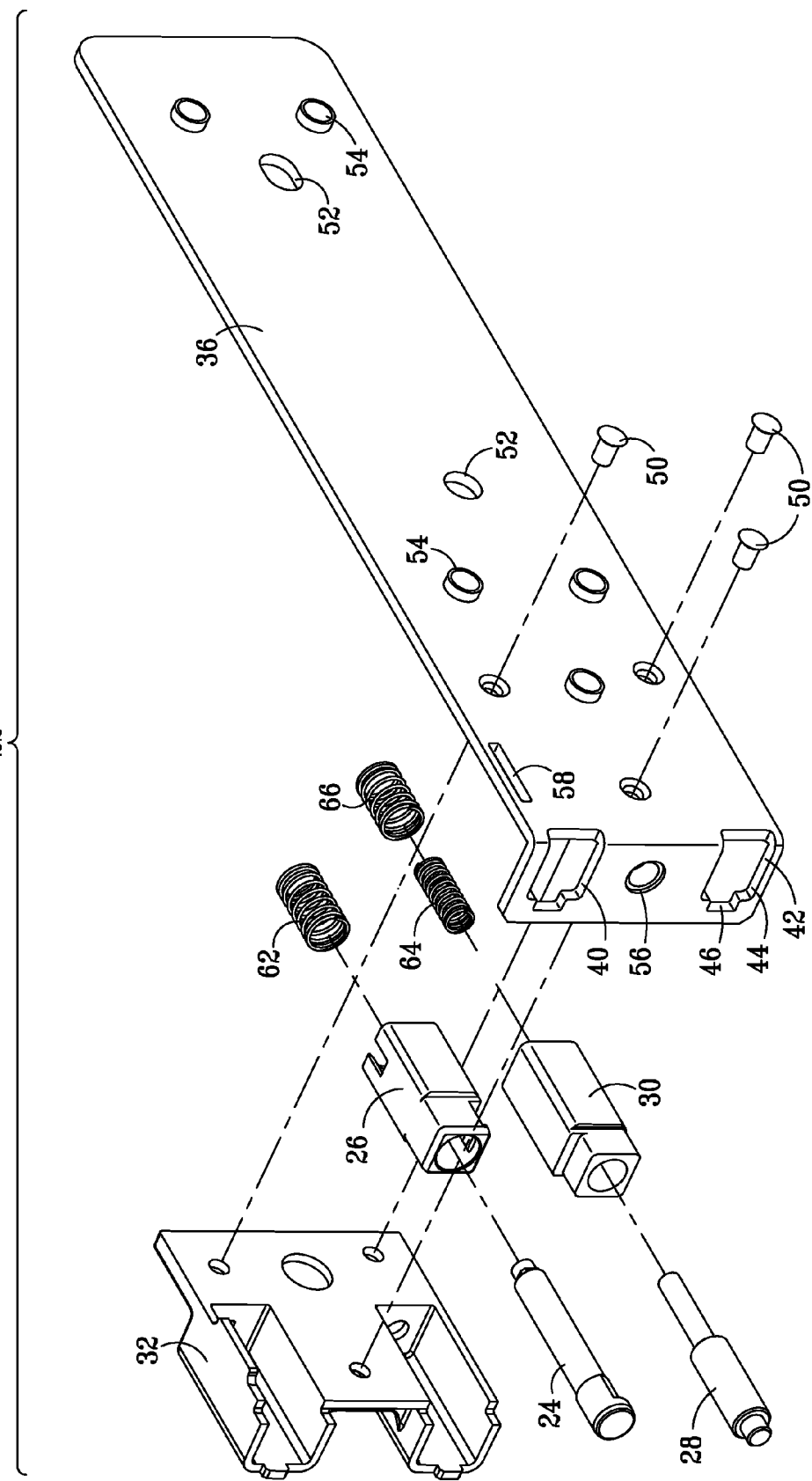
Figure 9:
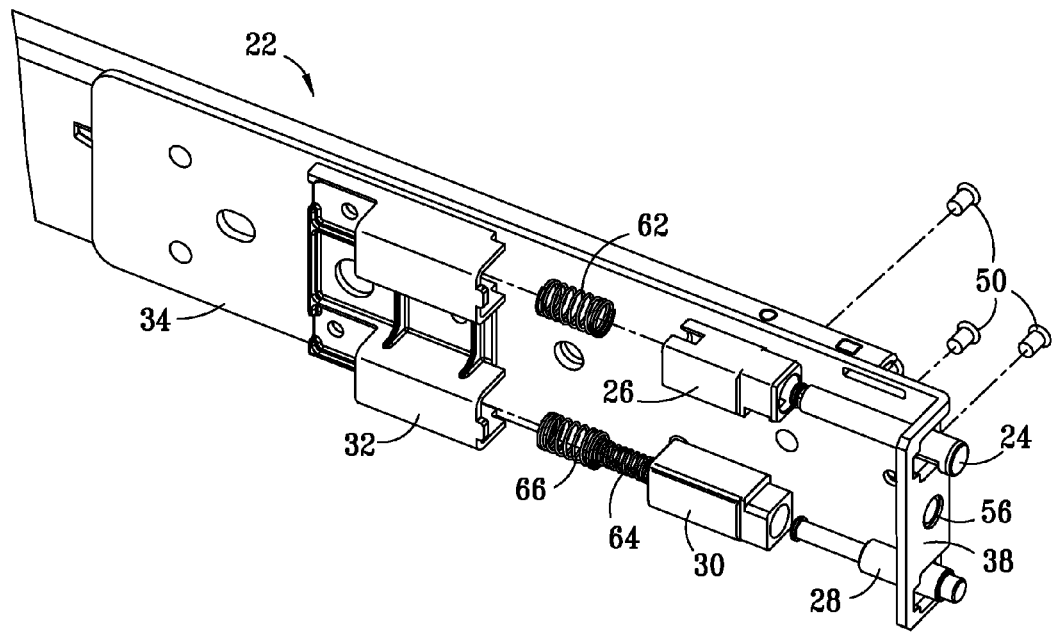

FIGS. 8 and 9 are exploded, perspective views of the mounting bracket 22, each taken from opposite sides of the mounting bracket 22. The bracket member 34 includes apertures 40 and 42 formed into the flange end 39 for receiving respective ones of support pin 24, the support sleeve 26, the lock pin 28, and the lock sleeve 30. The apertures 40 and 42 are a similar configuration and each include a larger portion 44 for receiving respective ones of the support sleeve 26 and the lock sleeve 30, and a smaller portion 46 for receiving tabs 184 of the housing 32. The apertures 48 are provided in the main body portion 36 for receiving rivets 50 for securing the housing cap 32 to the planar surface of the main body portion 36 of the bracket member 34. Mounting holes 52 and tabs 54 are provided for securing the bracket member 34 to the drawer slide 20, preferably with the planer surface of the main body 36 flush against a sidewall of the drawer slide 20. Mounting hole 56 is also provided in the flange end 38. A slot 58 is provided in the forward end of the main body portion 36 receiving a tab 186 of the housing 32. The mounting bracket 22 further includes springs 62, springs 64 and 66, which are preferably coil springs. The spring 62 is a bias means for urging the support sleeve 26 to resiliently extend from within the housing cover 32 and through the aperture 40 outward of the flange end 38. The springs 64 and 66 urge the lock pin 28 and the lock sleeve 30, respectively, to extend outward of the housing 32 and through the aperture 42 in the flange end 38.

Figure 10:
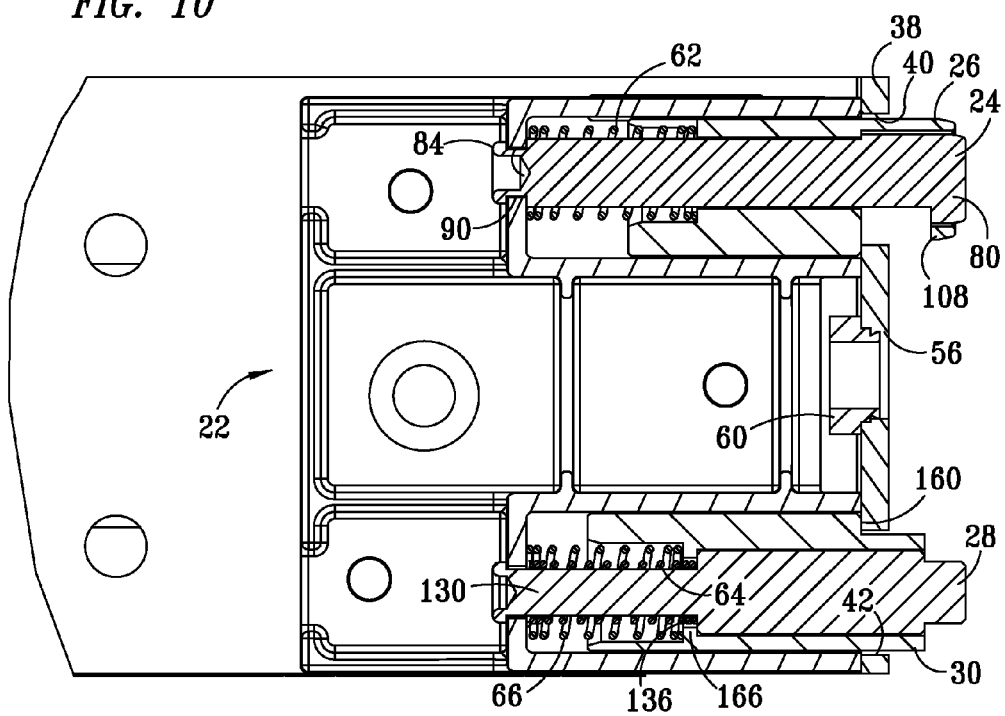

FIG. 10 is a longitudinal sectional view of the mounting bracket 22 taken along section line 10-10 of FIG. 7. A support pin assembly 25 is defined by the support pin 24 and the support sleeve 26. The support pin 24 and the support sleeve 26 extend outward through aperture 40 and flange end 38. The support pin 24 is preferably rigidly secured to an end of the housing 32, with a rivet end 84 not-rotatably secured within an aperture 188 in the housing 32. The support pin 24 has a tab 80, which provides a support pin protuberance, and the support sleeve 26 has a tab 108, which provides support sleeve protuberance, such that the protuberances 80 and 108 provide hooks for securing mounting bracket 22 to one of the corresponding ones of the round holes 18 of the rack 16, and the square holes 14 of the rack 12. The coil spring 62 extends between an end of the housing 32 and support sleeve 26 to urge the support sleeve 26 to extend outward through the aperture 40. A shoulder 74 (shown in FIG. 11) of the support pin 24 engages a stop shoulder 102 (show in FIG. 14) of the support sleeve 24, and a stop shoulder 100 of the support sleeve 24 engages the flange end 38 to define the distance the support sleeve extends from within the housing 32 and through the aperture 40.

A lock pin assembly 27 is defined by the lock pin 28 and the lock sleeve 30. The lock pin 28 is preferably slidably secured within an aperture 139 of the housing 32 by a rivet end 138 formed on the terminal end of the lock pin 28 and a shoulder 136. The rivet end 138 is spaced apart from the shoulder 36 to allow the lock pin 28 to resiliently extend from within the aperture 42, with the bias spring 64 providing a resilient biasing means. The bias spring 64 extends exteriorly around the rearward end portion of the lock sleeve 30. The lock sleeve 30 is slidably secured around the lock pin 28, and biased to extend through the aperture 42 by the bias spring 66. The lock sleeve 30 is secured within the housing 32 by a stop shoulder 160 and an annular-shaped tab 163. A clinch nut 60 has a threaded hole which is mounted adjacent the mounting hole 56 in the flange end 38 for receiving a thumb screw of a chassis member to prevent the drawer slide 20 from extending from either the racks 12 and 16.

Figure 11:
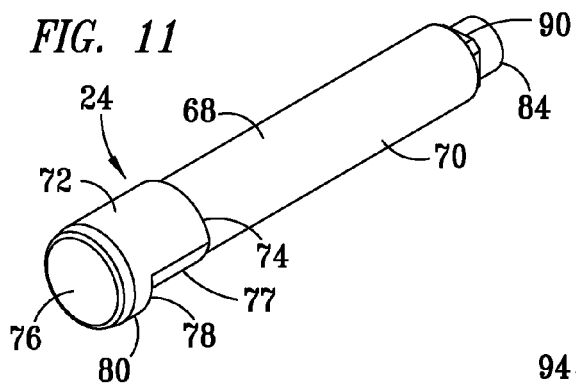
Figure 12:
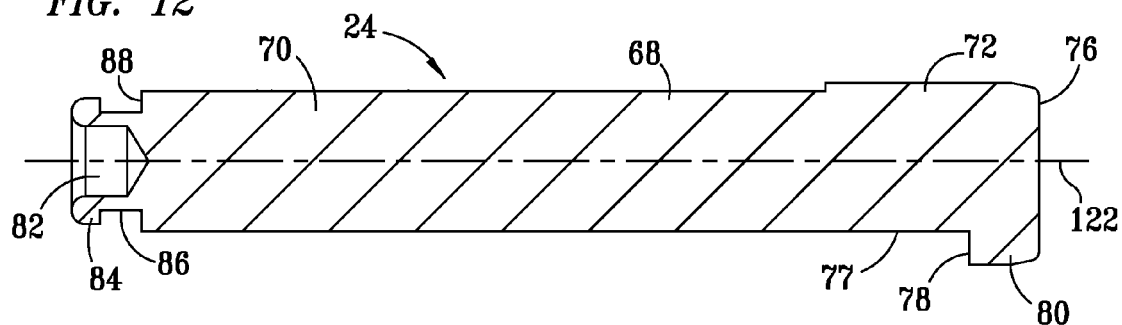

FIG. 11 is a perspective view and FIG. 12 is a longitudinal section view of the support pin 24. The support pin 24 has a body 68 with a narrower portion 70 which is of a smaller diameter than a larger portion 72 to define a shoulder 74. A flange face 76 is provided on a forward end of the body 68 and extends to shoulder 78 defined by tab portion 80. The tab 80 of the support pin 24 is preferably formed by providing a flat surface 77 formed into the enlarged diameter portion 70 of the support pin 24. The tab portion 80 provides a support sleeve protuberance which operates as a hook for securing within round holes 18 of the rack 16 shown in FIG. 2. Hole 82 is formed in the rearward end of body 68. The rivet end 84 includes a flat surface which provides a flat 90 for engaging a flat (not shown) formed in the aperture 188 to prevent rotation of the support pin 24 relative to the housing 32, having flats, and oval shape, or such. A flange 86 is spaced apart from the shoulder 88, on opposite sides of the surface 90. The support pin 24 has a central longitudinal axis 122 corresponding to the geometric centerline of the large portion 72 of the support pin body 68.

Figure 13:
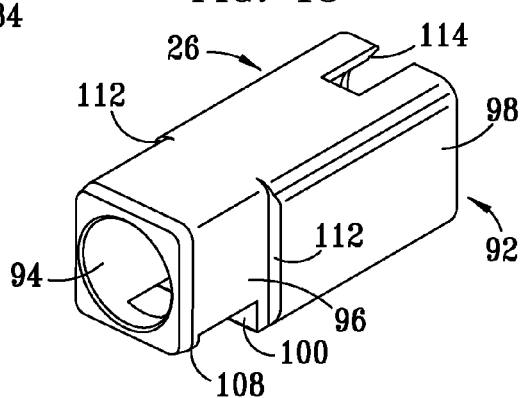
Figure 14:
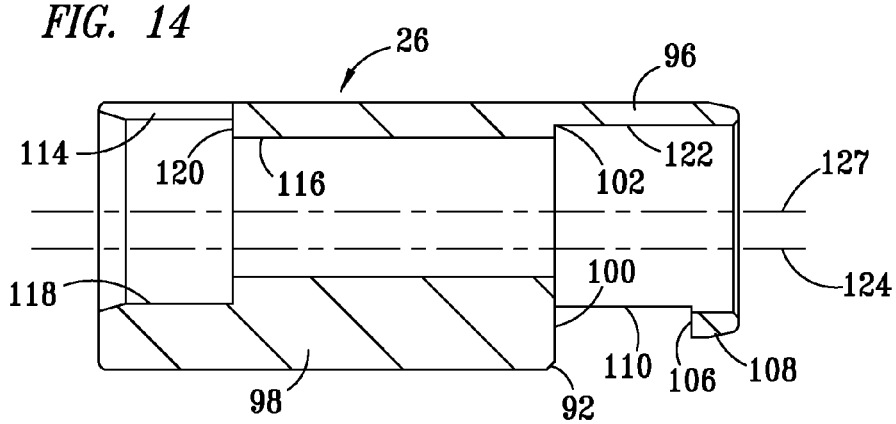

FIG. 13 is a perspective view and FIG. 14 is a longitudinal section view of the support sleeve 26. Support sleeve 26 has a body 92 with a longitudinally extending hole 94 for slidably receiving the support pin 24. The body 92 is preferably of a rectangular or square shape, having a smaller portion 96 and larger portion 98 which define a stop shoulder 112. The body 92 of the support sleeve 26 further includes a stop shoulder 110, a flange end 104 defining a tab 108 which defines a support sleeve protuberance providing a shoulder 106 spaced apart from the shoulder 100 by the recess 110. A notch 114 defines a slot formed into a rearward end of the sleeve 26. A hole 94 has a smaller ID portion 116 and a larger ID portion 118, which define a rearward facing, annular-shaped shoulder 120. A forward portion 122 of the hole 94 has a larger diameter portion 122 which with the smaller diameter portion 116 defines the forward facing shoulder 102. The larger portion 118 of the aperture 84 has a geometric centerline 124, and the smaller portion 116 of the aperture 94 has a geometric centerline 127. The two centerlines 124 and 127 preferably extend in parallel, and are spaced apart.

Figure 15:
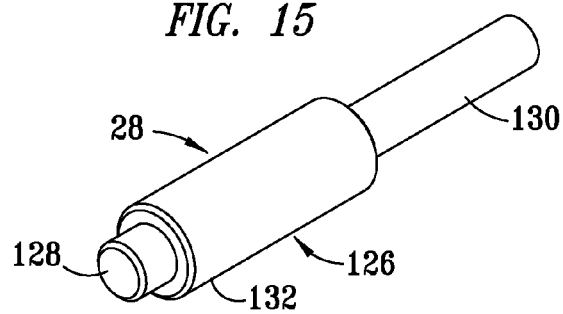

FIG. 15 is a perspective view and FIG. 16 is a longitudinal section view of the lock pin 28, which provides a first lock member for the mounting bracket 22. The lock pin 28 has a main body portion 126 which includes a forward portion 128, a central portion 132 and a rearward portion. The forward portion 128 has a smaller outside diameter than the central portion 132, and the rearward portion 130 has a smaller outside diameter than the forward portion 128. The annular-shaped shoulders 134 and 136 are defined between the central portion 132 and the forward portion 128, and the central portion 132 and the rearward portion 130, respectively. The periphery of the forward portion 128 and the central portion 132 defines engagement surfaces for engaging within round-hole racks to secure the support pin 24 within a respective one of the mounting holes 18 in the round-hole racks 16. The terminal rearward end of the lock pin 28 is defined by a rivet end 138. The rivet end 138 has a hole 140 and is formed to define an annular-shaped stop tab 142.

FIG. 17 is a perspective view and FIG. 18 is a longitudinal section view of lock sleeve 30, which provides a second lock member for the mounting bracket 22. The lock sleeve 30 has a main body 148 with a large portion 152 and a small portion 154, which define shoulders 156, 158 and 160. A hole 150 extends through the body 148 for receiving the lock pin 28. The hole 150 has a smaller diameter portion 162 and a larger, rearward diameter portion 164 with an annular-shaped tab 166 protruding inward between the portions 162 and 164. The smaller portion 154 has a flat defined thereon which provides and engagement surface 160 for engaging against an edge of one of the mounting holes 14 in the rack 12.

FIGS. 19 and 20 are perspective views of opposite sides of the housing cover 32 for the mounting bracket 22. The housing cover 32 has a planer body portion 172 in which mounting holes 174 are formed. Guide portions 176 adjacent the planer body portion 172 provides channels within respective ones of the support sleeve 26 and the lock sleeve 30 are slidably received. The channels 176, or guide portions, are preferably of U-shaped cross-section and have open sides 178 and open ends 180. An edge end 182 fits flush against the flange end 38 of the bracket member 34. The tabs 184 and 186 are provided for securing the housing 32 to the bracket member 34, with the tabs 74 fitting within the smaller portions 44 of the apertures 40 and 42. The tab 186 fits within the slot 58 in the bracket member 34.

FIGS. 21-24 are sectional views, as taken along section line 10-10 of FIG. 7, and show use of the mounting bracket 22 for securing to the rack 12 and the rack 16. FIG. 21 shows the mounting bracket 22 with the support sleeve 26 fully extended around the support pin 24, and both of the support pin 24 and the support sleeve 26 inserted through a square-shaped mounting hole 14 in the rack 12. The support pin 24 and the support sleeve 26 are disposed in an upward position within the mounting hole 14. The smaller diameter forward portion 128 of the lock pin 28 has been inserted into one of the mounting holes 14, spaced apart from the one of the mounting holes 14 in which the support pin 24 and the support sleeve 26 are disposed. The bracket 22 is then moved downward relative to the rack 12, disposing the tabs 80 and 108 adjacent the portion of the rack 12 immediately beneath the mounting hole 14 in which the support pin 24 and the support sleeve 26 are disposed, as shown in FIG. 22. Moving the bracket 22 downward to engage the tabs 80 and 108 adjacent the rack 12 aligns the lock sleeve 30 such that it registers with the adjacent one of the holes 14, and the lock sleeve 30 is inserted into the respective mounting hole 14, along with the larger diameter central portion 132 of the lock pin 28. The mounting bracket 22 is thus fixedly secured to the rack 12. The mounting bracket 22 is then removed from the rack 12 by pressing the lock pin 28 and the lock sleeve 30 rearward against the biasing force of the springs 64 and 66, respectively, to remove the lock pin 28 and the lock sleeve 30 from within the respective hole 14 in the rack 12. With the lock sleeve 30 removed from within the respective hole 14, and only the smaller diameter, forward portion 128 of the lock pin 28 within the respective mounting hole 14, the bracket 22 may be lifted upwards to the position shown in FIG. 21, which provides clearance between the respective mounting hole 14 and the tabs 80 and 108 for removal of the support pin 24 and the support sleeve 26 from within the mounting hole 14.

Figure 23:
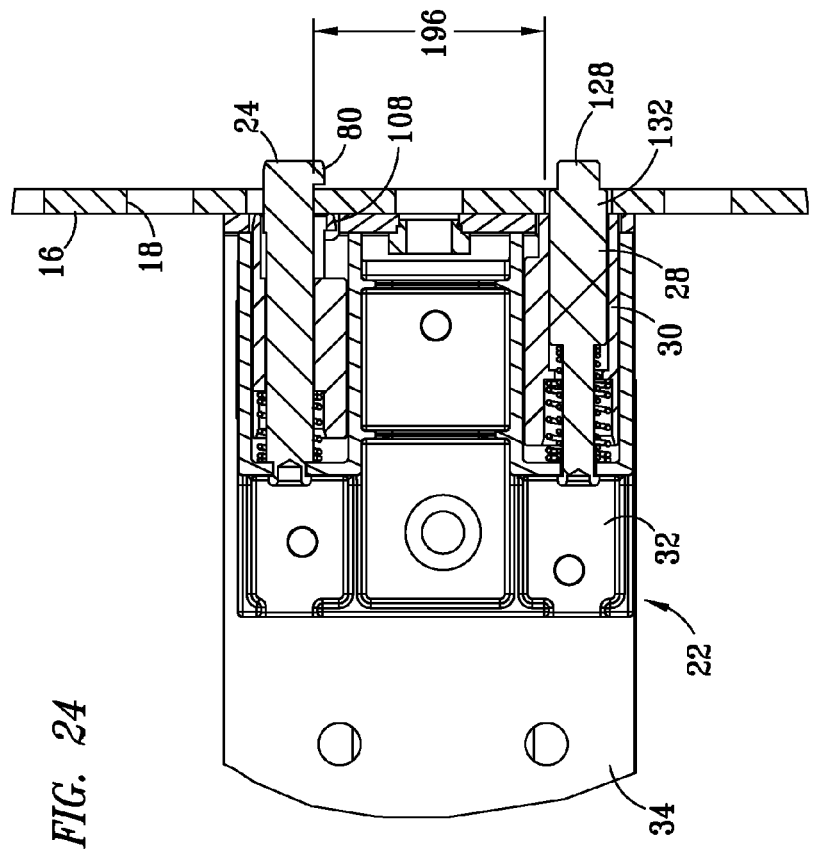
Figure 24:
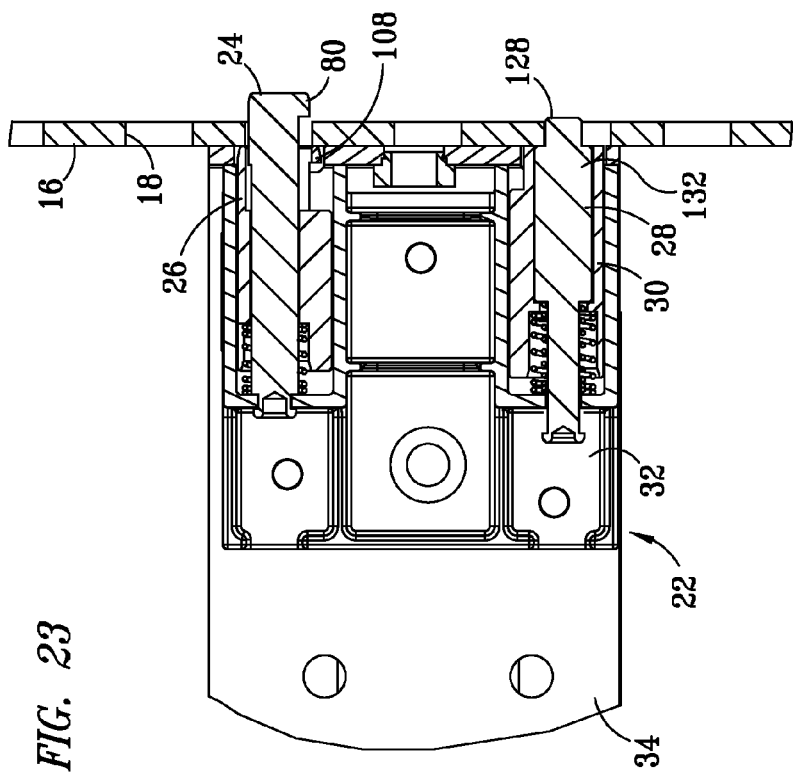

FIG. 23 shows the mounting bracket 22 with the support sleeve 26 fully retracted from extending around forward end of the support pin 24. The support pin 24 is inserted through one of the round-shaped mounting holes 18 in the rack 16. The support pin 24 is disposed in an upward position within the hole 14, with the support sleeve being disposed outside of the respective hole 18. Preferably, the support sleeve 26 is to large for fitting within the round-shaped holes 18 of the rack 16, and will be pushed rearward by the rack 16 when the support pins 24 are inserted into the round-shaped holes 18. The smaller diameter forward portion 128 of the lock pin 28 has been inserted into one of the holes 18, spaced apart from the one of the holes 18 in which the support pin 24 is disposed. The bracket 22 is then moved downward relative to the rack 16, disposing the tab 80 adjacent the portion of the rack 16 immediately beneath the hole 18 in which the support pin 24 is disposed, as shown in FIG. 24. Moving the bracket 22 downward to engage the tab 80 adjacent the rack 12 aligns the lock pin 28 such that it registers with the adjacent one of the holes 18, and the lock pin 28 is inserted into the respective hole 18, along with the larger diameter central portion 132 of the lock pin 28. The mounting bracket 22 is thus fixedly secured to the rack 18. The support sleeve 26 and the lock sleeve 30 are preferably of a size which is to large to fit within the holes 18 in the rack 16. The mounting bracket 22 is then removed from the rack 18 by pressing the lock pin 28 rearward against the biasing force of the spring 64, to remove the lock pin 28 from within the respective hole 16. With the lock pin 28 removed from within the respective hole 14, such that only the smaller diameter, forward portion 128 of the lock pin 28 is located within the respective hole 14, the bracket 22 may be lifted upwards to the position shown in FIG. 23, which preferably provides clearance between the respective hole 16 and the tab 80 for removal of the support pin 24 from within the hole 16.

Comparing FIG. 22 to FIG. 24, the support sleeve 26 has a surface in the recess 110 which engages an edge of one of the mounting holes 14 and the lock sleeve 30 has a surface 168 which engages an edge of another of the mounting holes 14, spaced apart by a distance 194. Similarly, the support pin 24 has the surface 77 which engages an edge of one of the mounting holes 18 and the lock pin 28 has the exterior surface of the end tip, or forward portion 128, spaced apart by a distance 196. The spacing 194 of the engagement points between the mounting bracket 22 and the square-hole rack 12 is less than the spacing 196 of the engagement points between the mounting bracket 22 and the round-hole rack 16. This difference in engagement spacing between engagement surfaces may also be configured by determining offsets between geometric centerlines 127 and 124 of respective engagement portions of the support pin 24 and the support sleeve 26, or offsets for the centerline 127 of the bore 150 extending through the support sleeve 26 and the centerline 124 of the exterior periphery of the support sleeve 26. Similarly, the differences in spacings 194 and 196 may be determined my forming contact surfaces in respective members, or by determining offsets between geometric centerlines of the lock pin periphery 28, the periphery of the lock sleeve 30 and the profiles of the bores 162 and 164 in the lock sleeve 30.

FIG. 25 is a partial perspective view and FIG. 26 is an end view of an alternative mounting bracket 202 and the drawer slide 20 secured to the square-hole rack 12. The mounting bracket 202 has a support pin 204 and a support sleeve 206 which, in conjunction with a lock pin 208, engage within holes 14 in the rack 12 to secure the mounting bracket 202 and drawer slide 20 to the square-hole rack 12. The support pin 204 and the support sleeve 206 are spaced apart from the lock pin 208 for registering in alignment with respective ones of the square-shaped mounting holes 14 of the rack 12. The support pin 204 and the support sleeve 206 fully extend through one of the square-shaped mounting holes 14, and provide hook members for securing the mounting bracket 202 to the rack 12. The lock pin 208 will extend fully into one of the mounting holes 14 to prevent the support pin 204 and the support sleeve 206 from being removed from the rack 12.

FIG. 27 is a partial perspective view and FIG. 28 is an end view of the alternative mounting bracket 202 and the drawer slide 20 secured to the round-hole rack 16. The support pin 204 in conjunction with the lock pin 208 engage in registration with spaced apart holes 18 in the round-hole rack 16 to secure the mounting bracket 202 and drawer slide 20 to the round-hole rack 16. When mounted to the round-hole rack 16, only the support pin 204 extends fully through one of the round-shaped mounting holes 18 to provide a hook member for securing the mounting bracket 202 to the rack 16. The support sleeve 206 is preferably of a size which prevents the support sleeve 206 from fitting through the holes 18 in the round-hole rack 16. The lock pin 208 extends only partially through the round holes 18 in the rack 16, rather than fully through as shown for the square-hole rack 12 in FIGS. 25 and 26.

Figure 29:
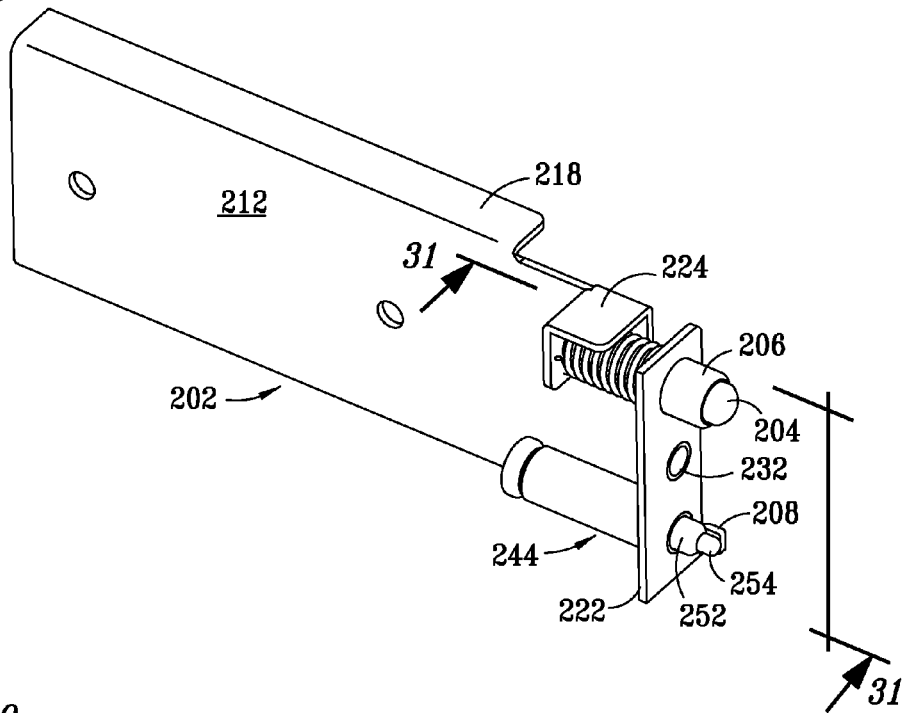
Figure 30:
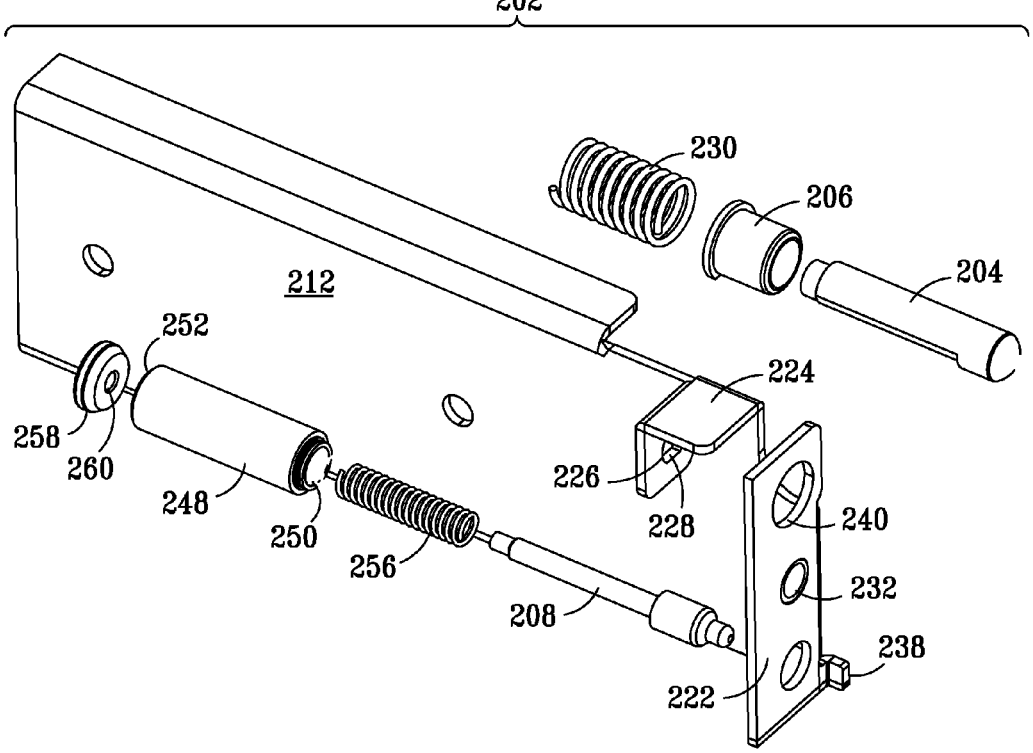
Figure 31:
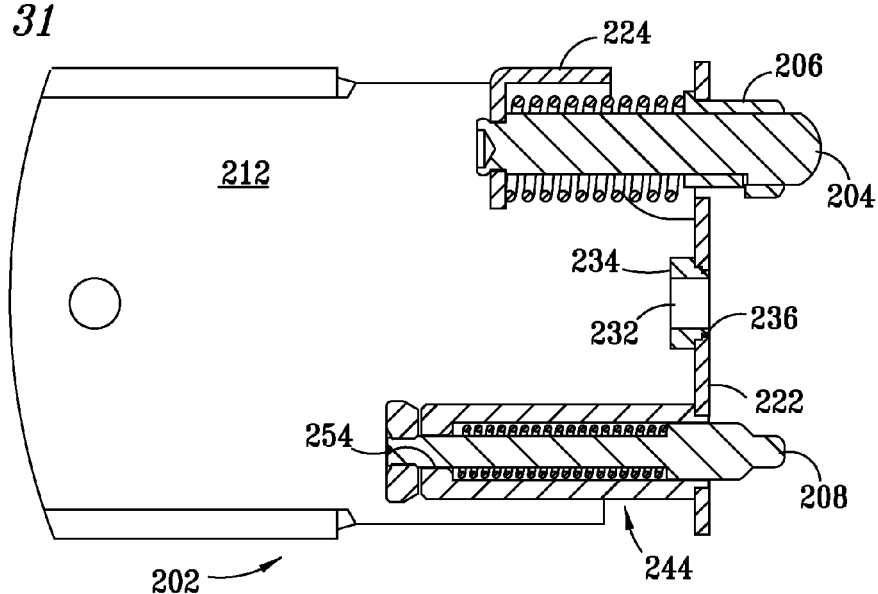

FIG. 29 is a perspective view, FIG. 30 is a partially exploded, perspective view of the alternative mounting bracket 202, and FIG. 31 is a partial section view taken along section line 31-31 of FIG. 29. The bracket 202 includes a bracket member 212 having a planar surface portion 214 with mounting holes 216, a flanged end 222, an elongate tab 218, and an L-shaped tab portion 224 which is preferably disposed between the elongate tab 218 and the flanged end 222. The support pin 204 is fixedly secured in a hole 226 in the L-shaped tab mounting portion 224, preferably by riveting the rearward end 270 of the support pin 204 within the hole 226 in the L-shaped mounting flange 224. Preferably, a flat 272 (shown in FIG. 32) in the support pin 204 engages with a flat 228 formed in the hole 226 to non-rotatably secure the support pin 204 to the bracket member 212, in fixed relation to the bracket member 212. The support sleeve 206 is slidably secured over the support pin 204, with a coil spring 256 providing a bias means for urging the support sleeve 206 to extend outward of the bracket member 212, over the support pin 204. The support pin 204 and the support sleeve 206 are aligned to extend from the forward end of the bracket member 212, extending through the aperture 240 in the flange end 222.

A lock plunger 244 is mounted to the bracket member 212, spaced apart from the support pin 204 and support sleeve 206 for registering in the mounting holes 14 when used for the square-hole rack 12 and for registering in mounting holes 18 when used for the round-hole rack 16, spaced apart from respective ones of the mounting holes 14 and 18 in which the support pin 204 and the support sleeve 186 are located. The plunger 244 preferably has a lock pin housing 248 and the lock pin 208, with the lock pin 208 moveably extensible from within the lock pin housing 248 for extending from a forward end of the bracket member 212. An end cap 258 has a hole 260 within which the lock pin 208 is secured in fixed relation to the end cap, preferably by riveting the rearward end 334 of the lock pin 208. The lock pin housing 248 is preferably provided by a cylindrical sleeve sized for slidably receiving the lock pin 208. The housing 248 has an exteriorly threaded forward end 250 for threadingly securing in a tapped hole 242 in the flange end 222 of the bracket member 212, to secure the housing 248 to the bracket member 212. The rearward end 252 of the lock pin housing 248 has an aperture 254 for passing a rearward shank portion 328 of the lock pin 208, and for providing a stop for the end cap 258 and a central portion 324 of the lock pin 208. A coil spring 256 provides a bias means for urging the lock pin 208 to extend from a forward end of the lock pin housing 248.

Figure 32:
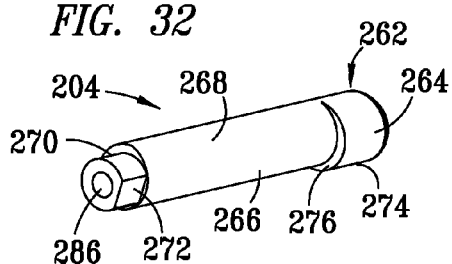
Figure 33:
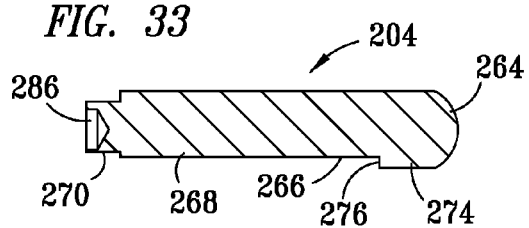

FIG. 32 is a perspective view and FIG. 33 is a longitudinal section view of the support pin 204. The support pin 204 has a body 262 with a forward end portion 264, a stem portion 268 and a rearward end portion 270. A shoulder 276 is defined on between the forward end portion 264 and the stem portion 268. The support pin 204 pin has a generally d-shaped profile on a forward end defined by a tab portion 274 which provides a support pin protuberance extending radially outward from the support pin 204 to define a shoulder 276, provided by an eccentrically turned body diameter with a central axis of the forward d-shaped end portion 264 offset from a central axis defining the stem portion 268 which is disposed adjacent to the shoulder 276, defining an engagement surface 266. The shoulder 276 defining the d-shaped end engages the support sleeve 206 to locate the support sleeve 206 relative to the rack 12, and the shoulder 276 will also engage the shoulder 306 in the interior bore of the support sleeve 206. The shoulder 276 fits against the outer end portion of the round-hole rack 16 to provide a drop and lock feature for hooking into the round holes 18 of the rack 16. The drop and lock features is provided by the stem portion 268 preferably fitting against the lower edge of one of the round holes 18 in the rack 16, such that the shoulder 276 drops beneath the lower edge of the respective round hole 18 and engages an outside surface of the rack 16. The rearward end of the support pin 204 has a shank 270 with a hole 286 extending into the terminal end and a flat 272 for non-rotatably mounting the support pin 204 to the L-shaped mounting flange 224 of the bracket member body 212. (See FIGS. 29-31). Preferably, mounting hole 226 formed into the L-shaped flange 224 will be formed to have a flat 228 to locate the flat 272 of the support pin 204 in an angular direction, such that the tab 274 and the shoulder 276 extend downward relative to the rack 16. (See FIG. 11).

Figure 34:
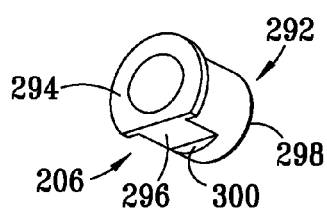
Figure 35:
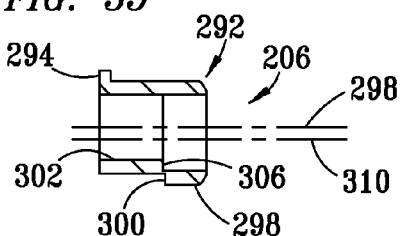

FIG. 34 is a perspective view and FIG. 35 is a longitudinal section view of the support sleeve 206. The support sleeve 206 preferably has a substantially cylindrically shaped body 244. A flat 296 is formed into the outer circumference of the cylindrically shaped body 292, preferably extending parallel to a central axis 248 of the body 292. A flange 294 is provided on one end of the support sleeve 206. An interior shoulder 306 is provided within the interior passage of the support sleeve 206, by forming the interior passages of a first hole 302 of a smaller diameter than a second hole 304, with the central axes thereof being offset such that the first and second holes 302 and 304 are in eccentric relation. The first hole 302 is formed into the rearward end of the support sleeve 206, and the second hole 304 is formed into the forward end of the support sleeve 206. The flange 294 is disposed on the rearward end of the support sleeve 206 to prevent the bias spring 230 from pushing the support sleeve 206 from passing through the hole 242 in the flanged end portion 222 of the bracket body 212. (See FIGS. 29-30). The flat 296 defines a tab 298 providing a support sleeve protuberance having a shoulder 300 for fitting against the outer end portion of a rack 12, to provide a drop and lock feature in the square-hole rack 12. The drop and lock feature is provided by the flat 296 preferably fitting against the lower edge of one of the square holes 14 in the rack 12, such that the shoulder 250 drops beneath the lower edge of one of the square holes 14 and engages an outer surface of the rack 12 to partially secure the support sleeve 206 within one of the holes 14 in the rack 12. The support sleeve 206 has an eccentrically shaped bore 302 and 304 which rides over the turned cross section of the stem portion 268 of the inner supporting pin 204. As the stem portion 268 of the support pin 204 and bore diameters 304 and 302 are eccentric they provide a sliding fit by which the support pin 204 and the support sleeve 206 cannot be revolved or torqued out of alignment. This keeps the working end of both pins in alignment with respective ones of the square-shaped mounting holes 14 of the rack 12 and the round-shaped mounting holes 18 of the rack 16.

Figure 36:
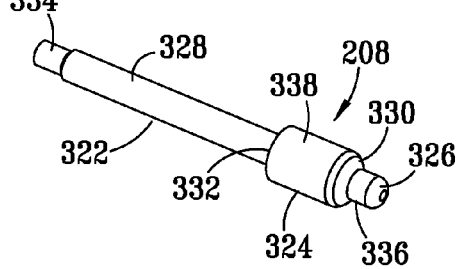
Figure 37:
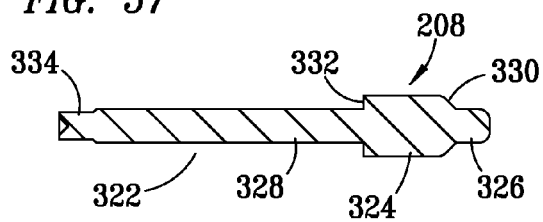

FIG. 36 is a perspective view and FIG. 37 is a longitudinal section view of the lock pin 208, which provides a lock member for the mounting bracket 202. The lock pin 208 has a main body portion 322 which includes a forward portion 326, or end tip, a central portion 324 and a rearward portion 328. The forward portion 326 has a smaller outside diameter than the central portion 324, and the rearward portion 328 has a smaller outside diameter than the forward portion 326. The annular-shaped shoulders 330 and 332 are defined between the central portion 324 and the forward portion 326, and the central portion 324 and the rearward portion 328, respectively. Preferably, the shoulder 330 is of a frusta-conical shape, to provide a tapered surface. The periphery of the forward portion 326 provides a first engagement surface 336 for engaging within one of the round mounting holes 18 in a round-hole rack to secure the support pin 204 within one of the round holes 18 in the round-hole racks 16, and the periphery of the central portion 324 provides a second engagement surface 338 for engaging within one of the square-holes 14 in a square-hole rack 12 to secure the support sleeve 206 within one of the square holes 14 of a square-hole rack. The terminal rearward end of the lock pin 208 provides a rivet end 334 for securing within the hole 260 in the end cap 258. In other embodiments, the end 334 and the end cap 258 may be threaded, or secured by other means. The end cap 334 provides a stopper for preventing the support pin from extending fully outward from the forward end 250 of the lock pin housing 248.

FIGS. 38-41 are sectional views, as taken along section line 31-31 of FIG. 29, and show use of the alternative mounting bracket 202 being secured to the rack 12 and the rack 16. FIG. 38 shows the mounting bracket 202 with the support sleeve 206 fully extended around the support pin 204, and both of the support pin 204 and the support sleeve 206 inserted through a square-shaped hole 14 in the rack 12. The support pin 204 and the support sleeve 206 are disposed in an upward position within the hole 14. The smaller diameter forward portion 128 of the lock pin 208 has been inserted into one of the holes 14, spaced apart from the one of the holes 14 in which the support pin 204 and the support sleeve 206 are disposed. The bracket 202 is then moved downward relative to the rack 12, disposing the tabs 274 and 298 adjacent the portion of the rack 12 immediately beneath the hole 14 in which the support pin 204 and the support sleeve 206 are disposed, as shown in FIG. 39. Moving the bracket 202 downward to engage the tabs 274 and 298 adjacent the rack 12 aligns the larger diameter portion 324 of the lock pin 208 such that it registers with the adjacent one of the holes 14, and the larger diameter portion 324 of the lock pin 208 is inserted into the respective hole 14, along with the larger diameter central portion 324 of the lock pin 208. The mounting bracket 22 is thus fixedly secured to the rack 12. The mounting bracket 202 is then removed from the rack 12 by pressing the lock pin 208 rearward against the biasing force of the coil spring 256 to remove the lock pin 208 from within one of the mounting holes 14. With the lock pine 208 removed from within the respective hole 14, and the bracket 202 may be lifted upwards to the position shown in FIG. 21, which provides clearance between the respective hole 14 and the tabs 274 and 298 for removal of the support pin 204 and the support sleeve 206 from within the hole 14.

Figure 40:
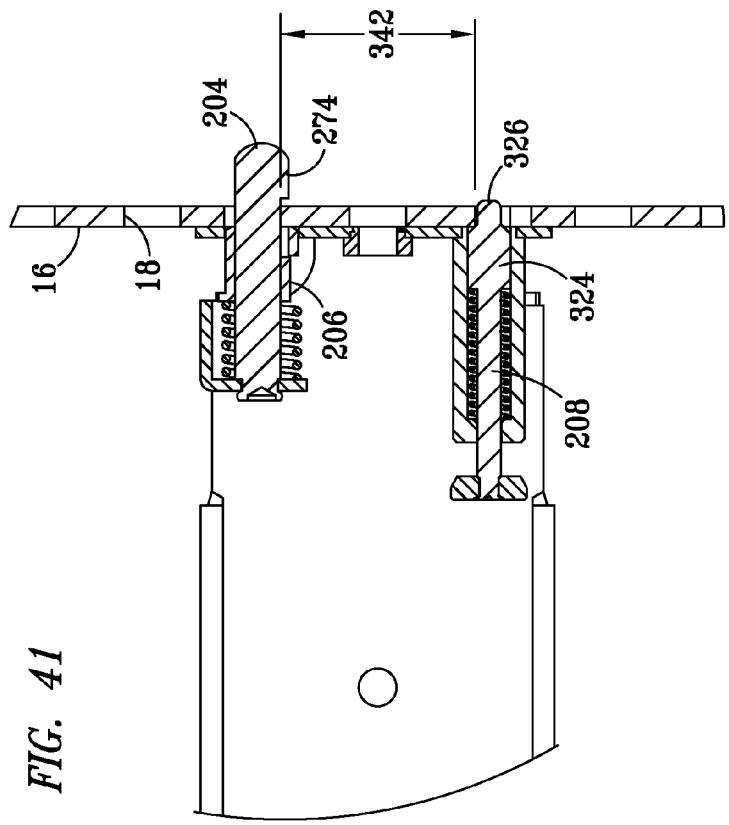
Figure 41:
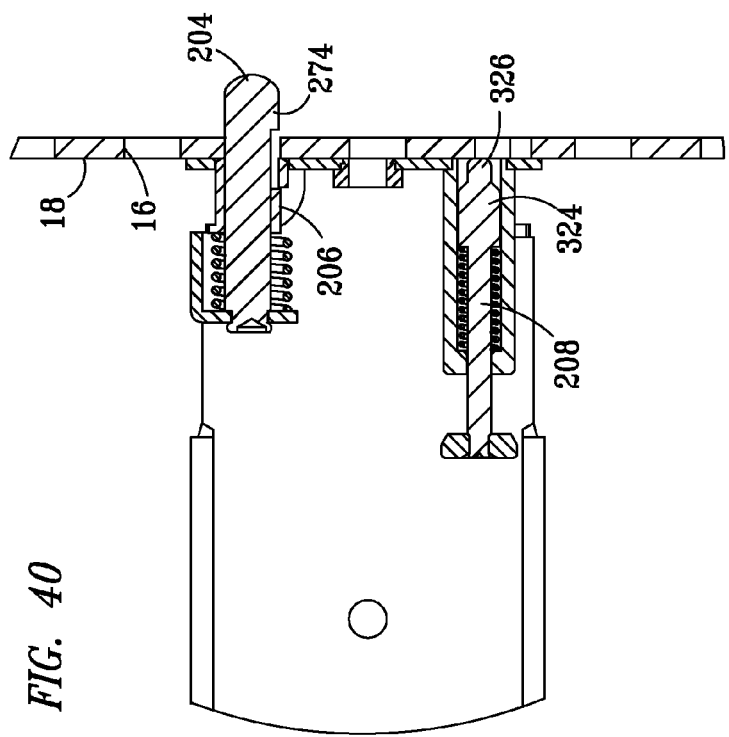

FIGS. 40-41 are sectional views, as taken along section line 31-31 of FIG. 29, and show operation of the mounting bracket 202 being secured to a round-hole rack. FIG. 40 shows the mounting bracket 202 with the support sleeve 206 fully retracted from extending around forward end of the support pin 204. The support pin 204 is inserted through one of the round-shaped mounting holes 18 in the rack 16. The support pin 204 is disposed in an upward position within the mounting hole 14, with the support sleeve being disposed outside of the respective hole 18. Preferably, the support sleeve 206 is to large for fitting within the round-shaped holes 18 of the rack 16, and will be pushed rearward by the rack 16 when the support pins 204 are inserted into the round-shaped holes 18. The smaller diameter forward portion 326 of the lock pin 208 has been inserted into one of the holes 18, spaced apart from the one of the holes 18 in which the support pin 204 is disposed. The bracket 202 is then moved downward relative to the rack 16, disposing the tab 274 adjacent the portion of the rack 16 immediately beneath the hole 18 in which the support pin 204 is disposed, as shown in FIG. 41. Moving the bracket 202 downward to engage the tab 274 adjacent the rack 12 aligns the lock pin 208 such that it registers with the adjacent one of the holes 18, and the lock pin 208 is inserted into the respective hole 18, along with the larger diameter central portion 276 of the lock pin 208. The mounting bracket 202 is thus fixedly secured to the rack 18. The support sleeve 206 and the lock sleeve 30 are preferably of a size which is to large to fit within the holes 18 in the rack 16. The mounting bracket 202 is then removed from the rack 18 by pressing the lock pin 208 rearward against the biasing force of the spring 64, to remove the lock pin 208 from within the respective hole 16. With the lock pin 208 removed from within the respective hole 14, such that only the smaller diameter, forward portion 128 of the lock pin 208 is located within the respective hole 14, the bracket 202 may be lifted upwards to the position shown in FIG. 40, which preferably provides clearance between the respective hole 16 and the tab 80 for removal of the support pin 204 from within the hole 16.

Comparing FIGS. 39 and 41, the support sleeve 206 has the flat 296 which provides an engagement surface for engaging an edge of one of the round mounting holes 18 and the lock pin 208 has a the outer periphery of the central portion 324 which engages an edge of another of the round mounting holes 18, spaced apart by a distance 340. Similarly, the support pin 204 has the exterior periphery of the stem portion 268 which defines an engagement surface 266 for engaging an edge of one of the mounting holes 18 and the lock pin 28 has the exterior surface of the end tip 326 which are spaced apart by a distance 342. The spacing 340 of the engagement points between the mounting bracket 202 and the square-hole rack 12 is less than the spacing 342 of the engagement points between the mounting bracket 202 and the round-hole rack 16. This difference in engagement spacing between engagement surfaces may also be configured by determining offsets between geometric centerlines of respective engagement portions of the support pin 204 and the support sleeve 206, or offsets for the centerlines of the bores 302 and 304 of the support sleeve 206. Similarly, the differences in spacings 194 and 196 may be determined my forming contact surfaces having exterior peripheries of different geometric centerlines. For the mounting bracket 202, the flat 296 formed into the support sleeve 206 and the periphery of the stem portion 268 defining the engagement surface 266 of the support pin 204 are determined in relation to the respective exterior diameters defined by the peripheries of the central portion 324 and the end tip 326 of the lock pin 208.

Thus the advantages of this invention provide a single mounting bracket which may be provided for securing slides and rails to server system racks having either square or round mounting holes. Having a mounting bracket for fitting both square and round holes assures that the correct bracket will be supplied. The rail brackets may be attached to either the front or rear of the server rack without using any hand tools, such as a screwdriver, wrench, or pliers. This simplifies installation and reduces the time required which is a cost saving. The rail bracket hardware that engages the rack can attach to both a round mounting hole and a square mounting hole rack. The round and square hole racks are the two standard approaches used on ninety percent of all racks sold in the server industry. The addition of a spring actuated plunger provides a tool-less locking feature to assure that the brackets do not vibrate loose from the rack. Since a locking fastener is not required the installation may be completed in less time. The respective diameters of the inner support pins, the outer support pins, and two portions of the plunger tip enable the mounting brackets to lock into a round or square hole rack.

Although the preferred embodiment has been described in detail, it should be understood that various changes, substitutions and alterations can be made therein without departing from the spirit and scope of the invention as defined by the appended claims.

What is claimed is:

1. A tool-less mounting bracket for securing to square-hole racks and round-hole racks, comprising:
    a bracket body;
    a support pin mounted to the bracket body and extending outward of said bracket body for extending from a forward end of said bracket body, said support pin sized for fitting within square-shaped holes of square-hole racks and within round-shaped holes of the round-hole racks, and having a support pin shoulder for passing through the round-shaped holes and fitting against an outward side of the round-hole racks;
    a support sleeve moveably mounted to said bracket body for extending over said support pin, wherein said support sleeve is sized for fitting within the square-shaped holes of the square-hole racks and is of larger size than the round-shaped holes of the round-hole racks for moving relative to said support pin for passing said support pin into said round-shaped holes of said round-hole racks, said support sleeve having a support sleeve shoulder for passing through the square-shaped holes and engaging against the outward side of the square-hole racks;
    a support sleeve bias member mounted to said bracket body and extending between said bracket body and said support sleeve for urging said the support sleeve to extend over said support pin; and
    at least one lock member mounted to said bracket body for extending outward of said forward end of said bracket body, said at least one lock member having an engagement surface for fitting into and engaging a respective one of the square-shaped holes of square-hole racks and the round-shaped holes of the round-hole racks for securing a respective one of said support pin within one of the round-shaped holes of the round-hole racks and said support sleeve within one of the square-shaped holes of the square-hole racks.

2. The tool-less mounting bracket according to claim 1, wherein said at least one lock member comprises a lock pin for fitting into and engaging a respective one of the round-shaped holes of the round-hole racks for securing said support pin within one of the round-shaped holes of the round-hole racks.

3. The tool-less mounting bracket according to claim 2, further comprising a lock sleeve moveably mounted to said bracket body for extending over said lock pin for slidably moving in relation to said lock pin, wherein said lock sleeve is sized for fitting within the square-shaped holes of the square-hole racks to secure said support sleeve within one of the square-shaped holes of the square-hole racks, and being of larger size than the round-shaped holes of the round-hole racks.

4. The tool-less mounting bracket according to claim 3, further comprising a lock sleeve spring extending between said bracket body and said lock sleeve for urging said lock sleeve to extend from said forward end of said bracket body.

5. The tool-less mounting bracket according to claim 4, further comprising:
    said a lock pin being moveably mounted to said bracket body; and
    a lock pin spring extending between said bracket body and said lock pin for urging said lock pin to extend from said forward end of said bracket body.

6. The tool-less mounting bracket according to claim 5, wherein said support pin is mounted in fixed relation to said bracket body, for extending from a forward end of said bracket body a fixed length.

7. The tool-less mounting bracket according to claim 6, wherein said lock sleeve and said support sleeve have cross-sections of substantially rectangular shapes.

8. The tool-less mounting bracket according to claim 1, wherein said lock member comprises a lock sleeve for fitting into and engaging a respective one of the square-shaped holes of the square-hole racks for securing said support sleeve within one of the square-shaped holes of the square-hole racks.

9. The tool-less mounting bracket according to claim 1, wherein said lock member comprises a lock pin having an end tip and an enlarged diameter portion, said end tip sized for engaging within the round-holes of the round-hole racks to secure said support pin within one of the round-holes of the round-hole racks, and said enlarged diameter portion sized for engaging within the square-holes of the square-hole racks to secure said support sleeve within one of the square-shaped holes of the square-hole racks.

10. The tool-less mounting bracket according to claim 9, further comprising said a lock pin bias member extending between said bracket body and said lock pin for urging said lock pin to extend from a forward end of said bracket body, wherein said lock pin is moveably mounted to said bracket member for extending therefrom to fit said end tip within the round-holes of the round-hole racks and said enlarged diameter portion moveably extending from said forward end of said bracket body for fitting within the square-holes of the square-hole racks.

11. A tool-less mounting bracket for securing to square-hole racks and round-hole racks, comprising:
    a bracket body;
    a support pin mounted to the bracket body and extending outward of said bracket body for extending from a forward end of said bracket body, said support pin sized for fitting within square-shaped holes of square-hole racks and within round-shaped holes of the round-hole racks, and having a support pin protuberance for passing through the round-shaped holes and fitting against an outward side of the round-hole racks;
    a support sleeve moveably mounted to said bracket body for extending over said support pin, wherein said support sleeve is sized for fitting within the square-shaped holes of the square hole racks and is of larger size than the round-shaped holes of the round-hole racks for moving relative to said support pin for passing said support pin into said round-shaped holes of said round-hole racks, said support sleeve having a support sleeve protuberance for passing through the square-shaped holes and engaging against the outward side of the square-hole racks;
    a support sleeve bias member mounted to said bracket body and extending between said bracket body and said support sleeve for urging said the support sleeve to extend over said support pin;
    a lock pin mounted to said bracket body and extending in spaced apart alignment with said support pin for fitting into and engaging a respective one of the round-shaped holes of the round-hole racks for securing said support pin within one of the round-shaped holes of the round-hole racks; and a lock sleeve moveably mounted to said bracket body for extending over said lock pin, spaced apart from and aligned with said support sleeve for fitting within one of the square-shaped holes of the square-hole racks to secure said support sleeve within one of the square-shaped holes of the square-hole racks, and being of larger size than the round-shaped holes of the round-hole racks.

12. The tool-less mounting bracket according to claim 11, further comprising a lock sleeve spring extending between said bracket body and said lock sleeve for urging said lock sleeve to extend over said lock pin.

13. The tool-less mounting bracket according to claim 11, further comprising:
    said a lock pin being moveably mounted to said bracket body; and
    a lock pin spring extending between said bracket body and said lock pin for urging said lock pin to extend forward of said bracket body.

14. The tool-less mounting bracket according to claim 13, wherein said support pin is mounted in fixed relation to said bracket body, for extending from a forward end of said bracket body a fixed length.

15. The tool-less mounting bracket according to claim 14, wherein said support sleeve and said lock sleeve have cross-sections of substantially rectangular shapes.

16. A tool-less mounting bracket for securing to square-hole racks and round-hole racks, comprising:
    a bracket body;
    a support pin mounted to the bracket body and extending outward of said bracket body for extending from a forward end of said bracket body, said support pin sized for fitting within square-shaped holes of square-hole racks and within round-shaped holes of the round-hole racks, and having a support pin protuberance for passing through the round-shaped holes and fitting against an outward side of the round-hole racks;
    a support sleeve moveably mounted to said bracket body for extending over said support pin, wherein said support sleeve is sized for fitting within the square-shaped holes of the square-hole racks and is of larger size than the round-shaped holes of the round-hole racks for moving relative to said support pin for passing said support pin into said round-shaped holes of said round-hole racks, said support sleeve having a support sleeve protuberance for passing through the square-shaped holes and engaging against the outward side of the square-hole racks;
    a support sleeve bias member mounted to said bracket body and extending between said bracket body and said support sleeve for urging said the support sleeve to extend over said support pin; and
    a lock pin mounted to said bracket body for extending outward of said forward end of said bracket body, said lock pin having an end tip portion and an enlarged diameter portion, said end tip portion being sized for fitting into and engaging a respective one of the round-shaped holes of round-hole racks for securing said support pin within one of the round-shaped holes of the round-hole racks, and said enlarged diameter portion being sized for fitting into and engaging a respective one of the square-shaped holes of square-hole racks for securing said support sleeve within one of the square-shaped holes of the square-hole racks.

17. The tool-less mounting bracket according to claim 16, further comprising:
    said a lock pin being moveably mounted to said bracket body; and
    a lock pin spring extending between said bracket body and said lock pin for urging said lock pin to extend from said forward end of said bracket body.

18. The tool-less mounting bracket according to claim 17, wherein said support pin is mounted in fixed relation to said bracket body, for extending from a forward end of said bracket body a fixed length.

19. The tool-less mounting bracket according to claim 18, further comprising said a lock pin bias member extending between said bracket body and said lock pin for urging said lock pin to extend from a forward end of said bracket body, wherein said lock pin is moveably mounted to said bracket member for extending therefrom to fit said end tip within the round-holes of the round-hole racks and said enlarge diameter portion within the square-holes of the square-hole racks.

20. The tool-less mounting bracket according to claim 19, wherein said lock pin and said support sleeve have a cross-sections of substantially round shapes.

* * * * *